(12) United States Patent
Hollman et al.

(10) Patent No.: US 6,803,756 B2
(45) Date of Patent: Oct. 12, 2004

(54) WAFER PROBE STATION

(75) Inventors: Kenneth F. Hollman, Carson City, NV (US); Daniel L. Harrison, Carson City, NV (US)

(73) Assignee: The Micromanipulator Company, Inc., Carson City, NV (US)

(*) Notice: Subject to any disclaimer, the term of this patent is extended or adjusted under 35 U.S.C. 154(b) by 0 days.

(21) Appl. No.: 10/134,908

(22) Filed: Apr. 29, 2002

(65) Prior Publication Data

US 2002/0118009 A1 Aug. 29, 2002

Related U.S. Application Data

(62) Division of application No. 09/615,454, filed on Jul. 13, 2000, now Pat. No. 6,424,141.

(51) Int. Cl.[7] .............................................. G01R 31/02
(52) U.S. Cl. .................... 324/158.1; 324/324; 324/754; 324/760
(58) Field of Search .............................. 324/158.1, 754, 324/758, 760, 765, 537; 174/35 R, 35 MS; 438/17

(56) References Cited

U.S. PATENT DOCUMENTS

| | | | |
|---|---|---|---|
| 4,884,026 A | 11/1989 | Hayakawa et al. | |
| 5,220,277 A | 6/1993 | Reitinger | |
| 5,266,889 A | 11/1993 | Harwood et al. | |
| 5,309,088 A | 5/1994 | Chen | |
| 5,345,170 A | 9/1994 | Schwindt et al. | |
| 5,434,512 A | 7/1995 | Schwindt et al. | |
| 5,457,398 A | 10/1995 | Schwindt et al. | |
| 5,568,054 A | 10/1996 | Iino et al. | |
| 5,610,529 A | 3/1997 | Schwindt | |
| 5,835,997 A | 11/1998 | Yassine | |
| 5,963,027 A | 10/1999 | Peters | |
| 6,362,636 B1 * | 3/2002 | Peters et al. | 324/754 |

FOREIGN PATENT DOCUMENTS

| | | |
|---|---|---|
| JP | 63138745 | 6/1988 |
| JP | 2220453 | 9/1990 |
| JP | 7084003 | 3/1995 |

OTHER PUBLICATIONS

Koyama, R.Y. and Buehler, M.G., *Semiconductor Measurement Technology: A Wafer Chuck for Use Between –196 and 350C*, U.S. Department of Commerce, National Technical Information Service, PB–293298, National Bureau of Standards, SP 400–55, pp. 1–17 (Jan. 1979).

(List continued on next page.)

Primary Examiner—Ernest Karlsen
(74) Attorney, Agent, or Firm—Fitch, Even, Tabin & Flannery

(57) ABSTRACT

The invention relates to a chuck apparatus for a wafer probe station in which the central conductive surface supports a device-under-test (DUT) over a conductive lower chuck portion. An insulator positions the center conductor surface of the chuck above the lower chuck portion and also positions an electrically isolated conductor along its periphery. A laterally extending shielding element is provided for shielding electromagnetic interference (EMI) from the center conductor surface and the lower chuck portion. The electrically isolated conductor and the conductive lower chuck portion may cooperate to form a line-of-sight electrical barrier between the center conductor surface and the laterally extending shielding element. The invention further relates to methods of manufacturing the chuck apparatus and using the apparatus to accomplish low current and voltage tests in a probe station.

25 Claims, 23 Drawing Sheets

OTHER PUBLICATIONS

Koyama, R.Y. and Buehler, M.G., *Novel variable–temperature chuck for use in the detection of deep levels in processed semiconductor wafers*, Review of Scientific Instruments, vol. 50, No. 8, pp. 983–987 (Aug. 1979).

*Test Station ACCESSORIES*, A1007517, The Micromanipulator Company, Inc., pp. 1–2 (1988).

*Basics of Low Current Probing* Application Note, A1009492, The Micromanipulator Company, Inc., pp. 1–8 (1987).

Yamamoto, Yousuke, *A Compact Self–Shielding Prober for Accurate Measurement of On–Wafer Electron Devices*, IIEE Transactions on Instrumentation and Measurement, vol. 38, No. 6, pp. 1088–1093 (Dec. 1989).

*Triaxial Vacuum Chuck Theory of Operation*, Internal Product Information, A1009706, The Micromanipulator Company, Inc., pp. 1–3 (No date).

Dickson, Brian and Branst, Lee, *Wafer Probing: Femtoamp Measurements Require Attention to Details*, Test & Measurement World, pp. 37–38 and 41–42 (Jan. 1998).

Micromanipulator Company, Inc. drawing entitled *Hsm Chuck Mechanical Assembly*, which depicts a Micromanipulator Company chuck assembly that was in public use or on sale prior to Jul. 13, 1999.

Micromanipulator Company, Inc. drawing entitled *HSM Chuck Cut Away View*, which depicts a Micromanipulator Company chuck assembly that was in public use or on sale prior to Jul. 13, 1999.

Micromanipulator Company, Inc. drawing entitled *Heater Element Insulation*, which depicts a Micromanipulator Company chuck assembly that was in public use or on sale prior to Jul. 13, 1999.

Micromanipulator Company, Inc. drawing entitled *HCSM Chuck Mechanical Assembly*, which depicts a Micromanipulator Company chuck assembly that was in public use or on sale prior to Jul. 13, 1999.

Micromanipulator Company, Inc. drawing entitled *HCSM Chuck Cut Away View*, which depicts a Micromanipulator Company chuck assembly that was in public use or on sale prior to Jul. 13, 1999.

Temptronics, Inc. drawing entitled *Temptronics "Guarded" Chuck*, which depicts a Temptronics, Inc. chuck assembly that was in public use or on sale prior to Jul. 13, 1999.

Micromanipulator Company, Inc. drawing entitled *Chuck Mechanical Assembly*, which depicts a Micromanipulator Company chuck assembly that was in public use or on sale prior to Jul. 13, 1999.

Micromanipulator Company, Inc. drawing entitled *Chuck Cut Away View*, which depicts a Micromanipulator Company chuck assembly that was in public use or on sale prior to Jul. 13, 1999.

Micromanipulator Company, Inc. drawing entitled *Low Noise Chuck Mechanical Assembly*, which depicts a Micromanipulator Company chuck assembly that was in public use or on sale prior to Jul. 13, 1999.

Micromanipulator Company, Inc. drawing entitled *Chuck Cut Away View*, which depicts a Micromanipulator Company chuck assembly that was in public use or on sale prior to Jul. 13, 1999.

Micromanipulator Company, Inc. drawing entitled *H1000 Chuck Assembly*, which depicts a Micromanipulator Company chuck assembly that was in public use or on sale prior to Jul. 13, 1999.

Micromanipulator Company, Inc. drawing entitled *H1000 Chuck Cut Away View*, which depicts a Micromanipulator Company chuck assembly that was in public use or on sale prior to Jul. 13, 1999.

* cited by examiner

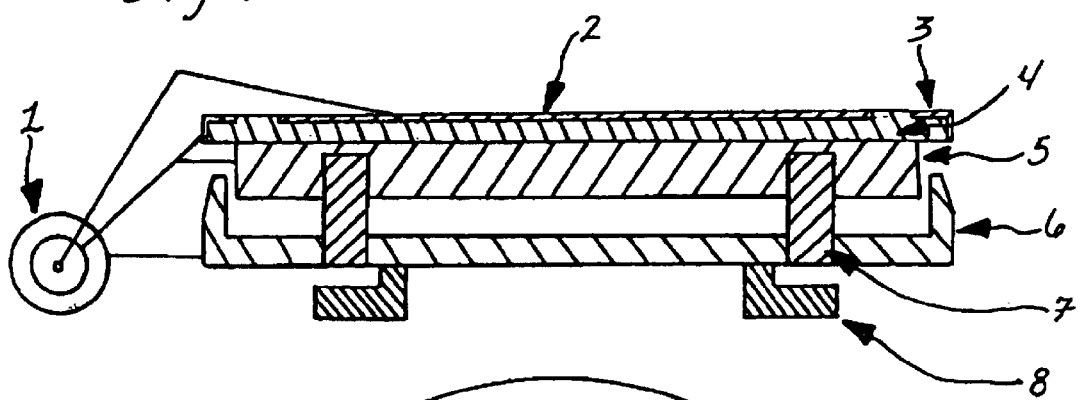
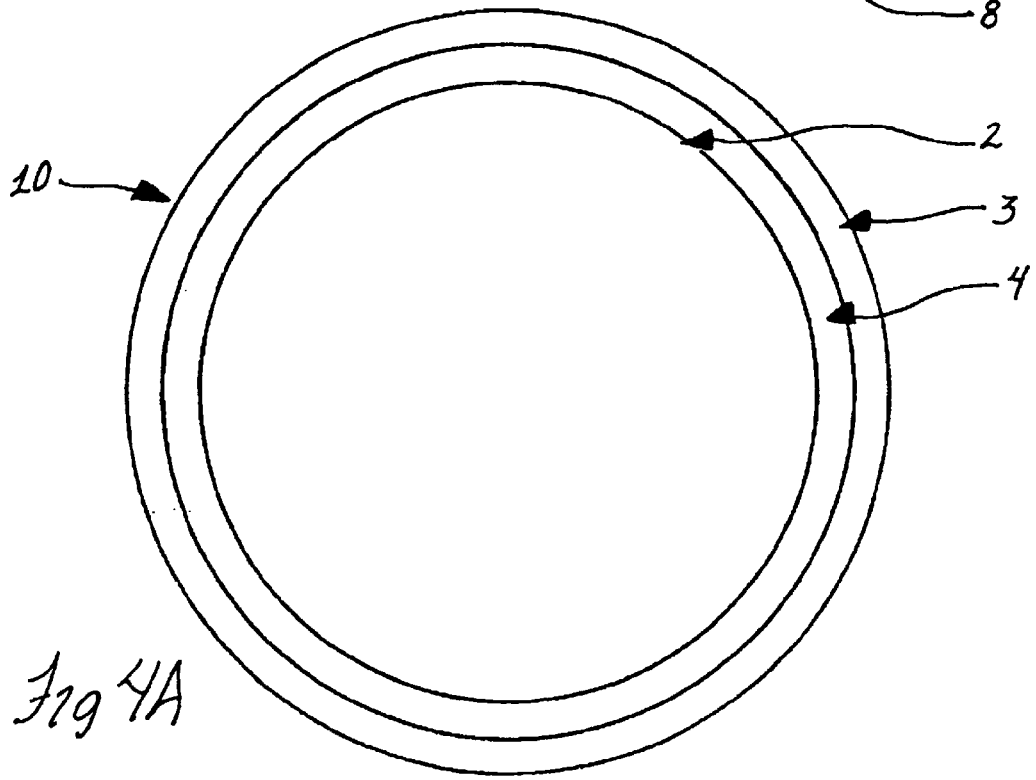

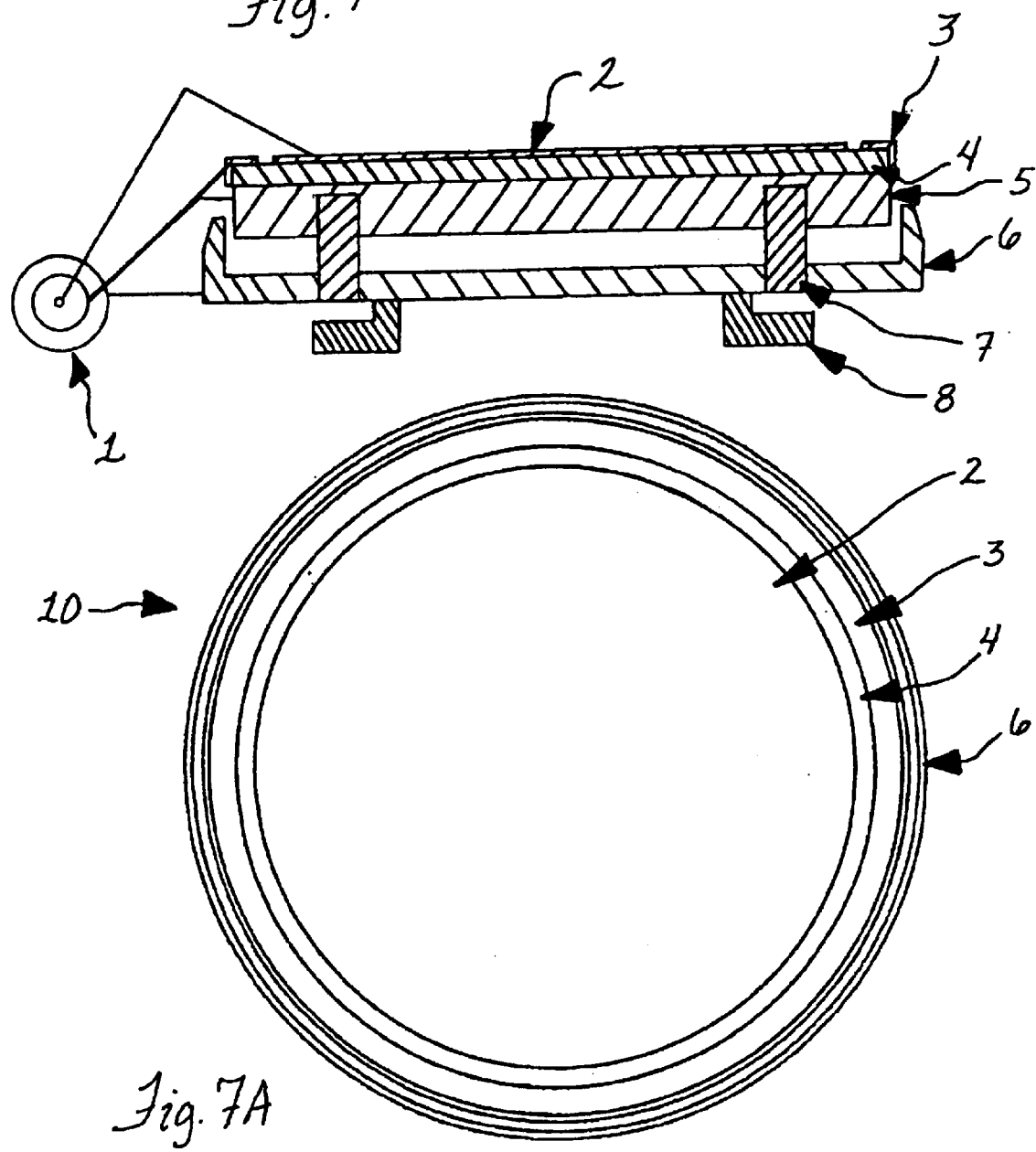

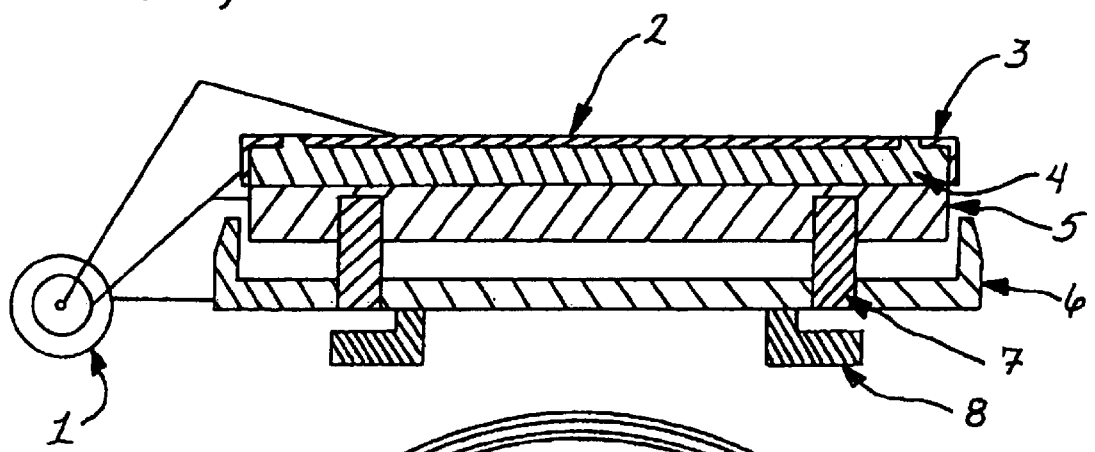
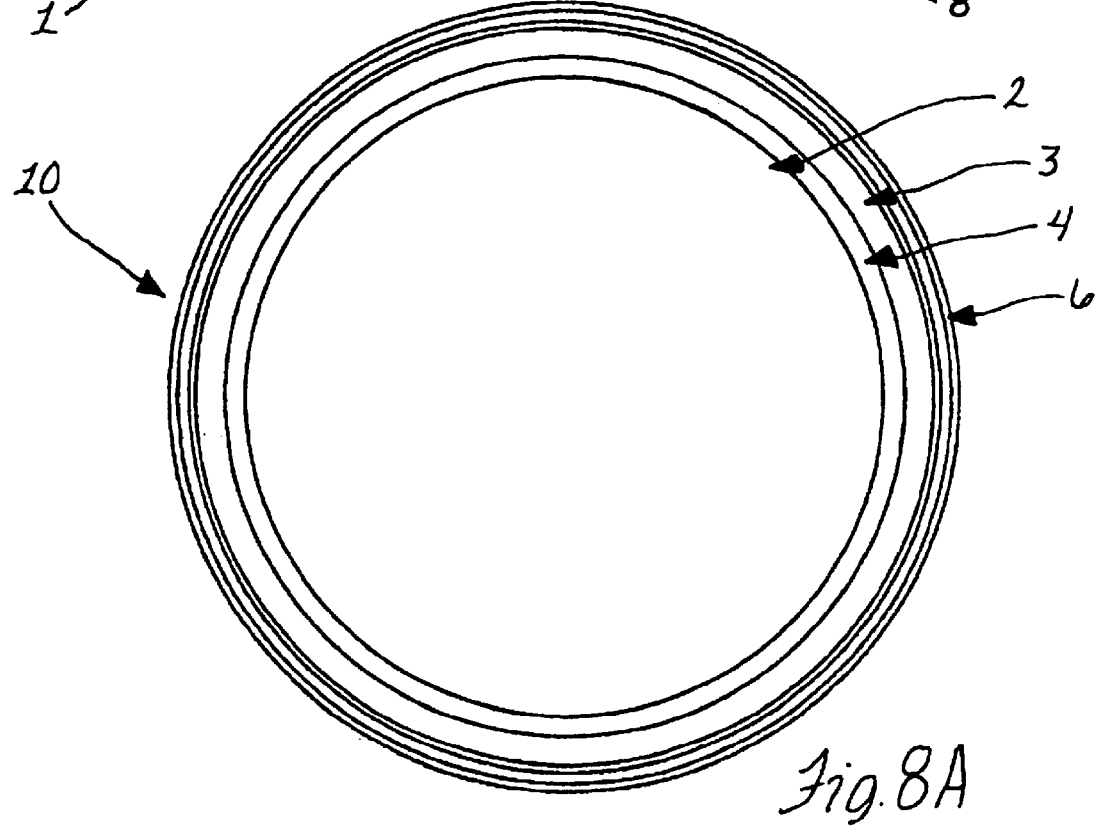

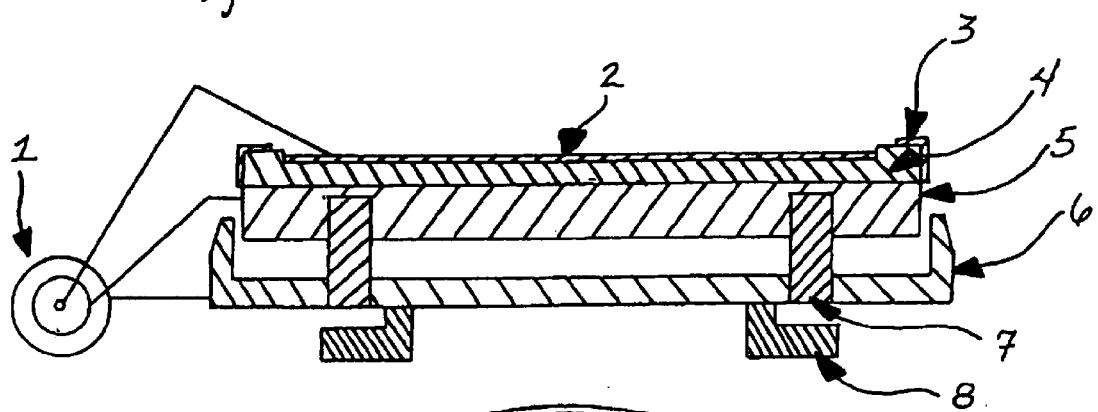
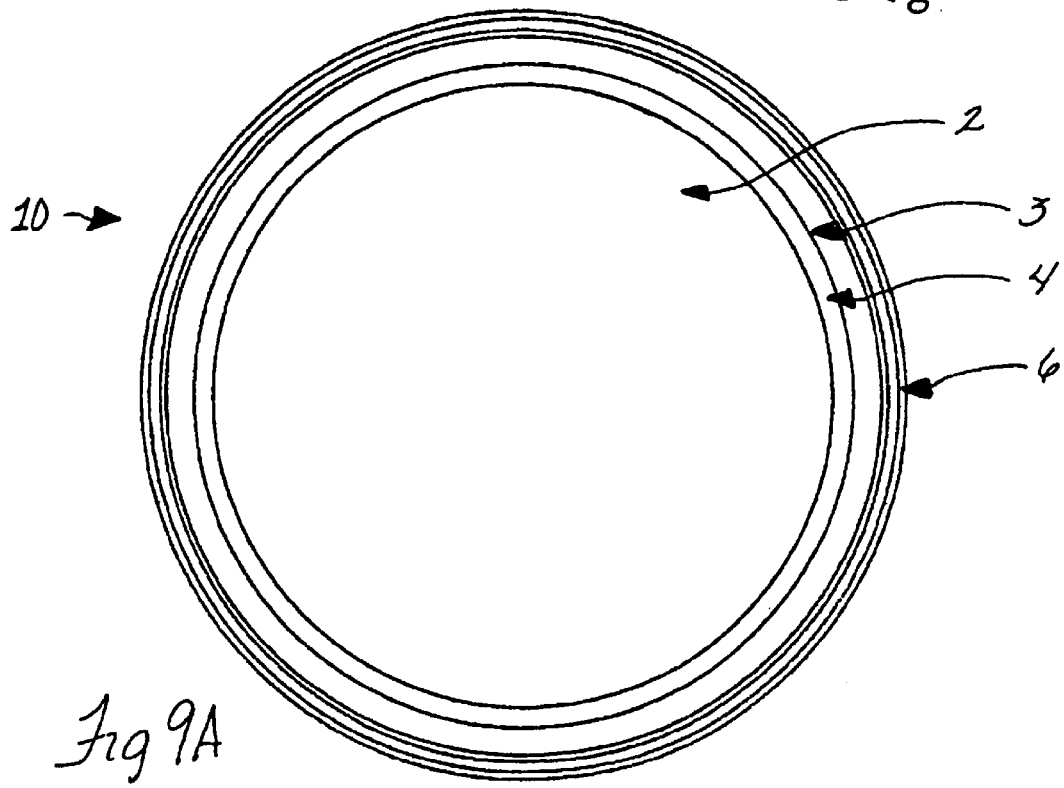

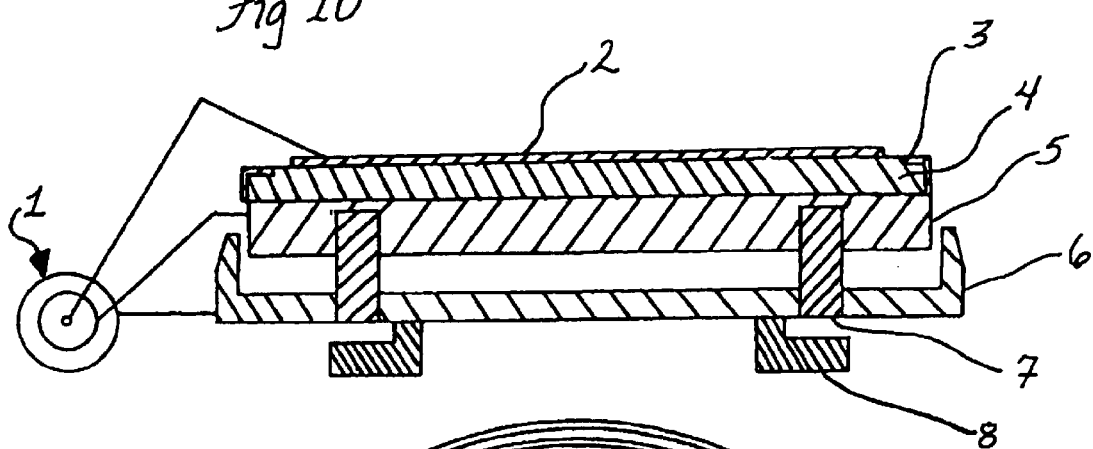
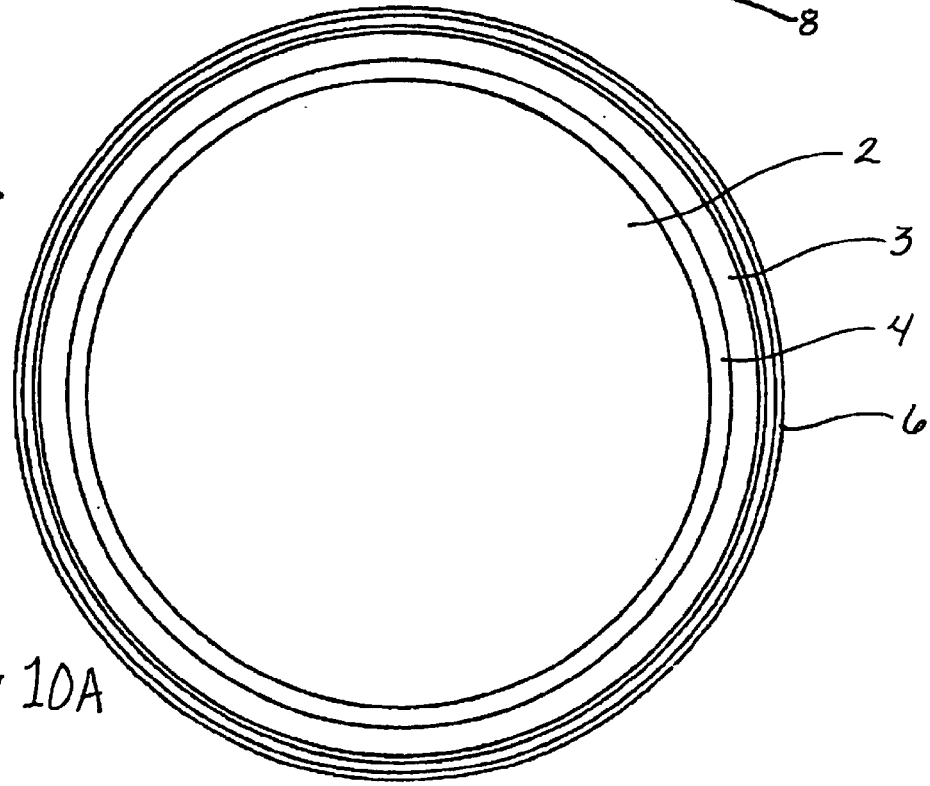

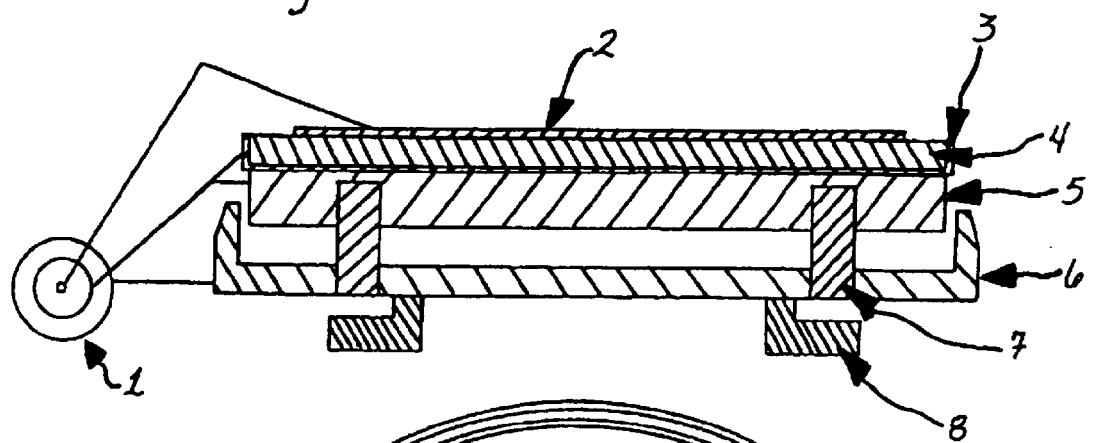
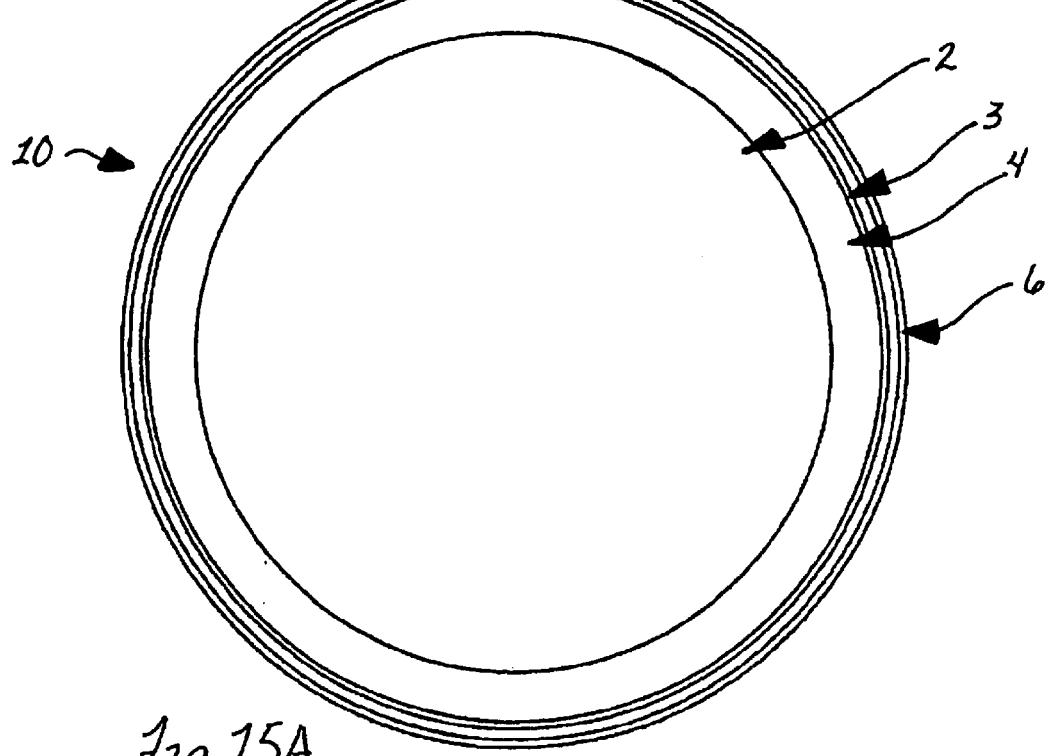

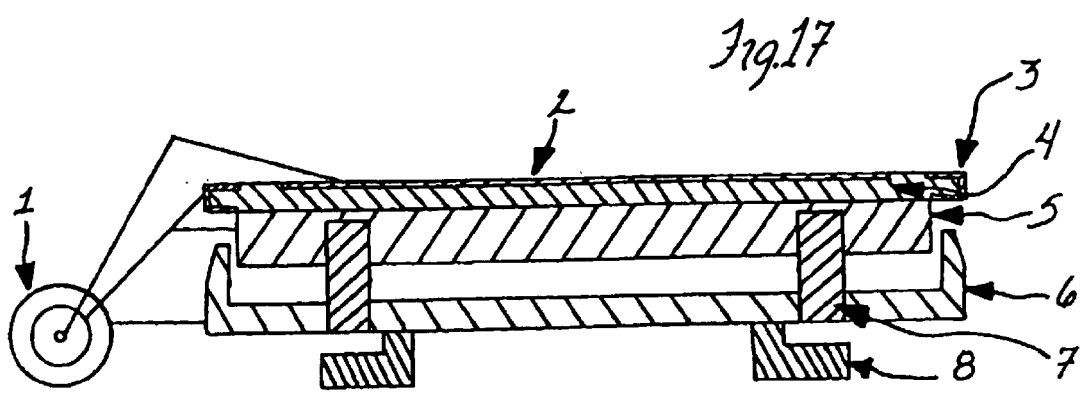
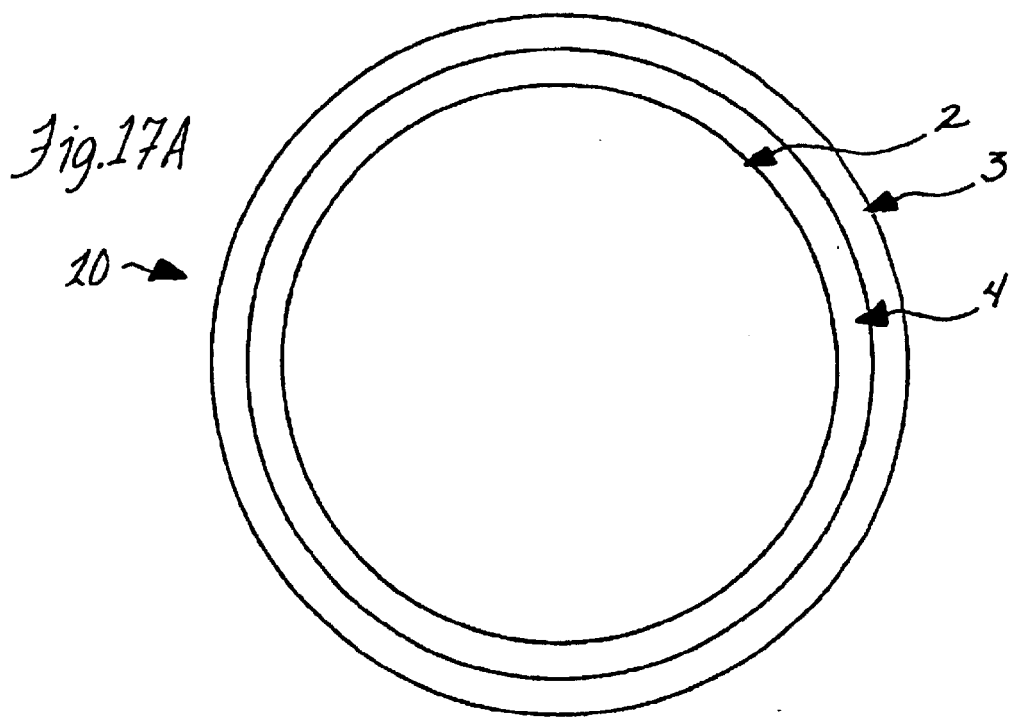

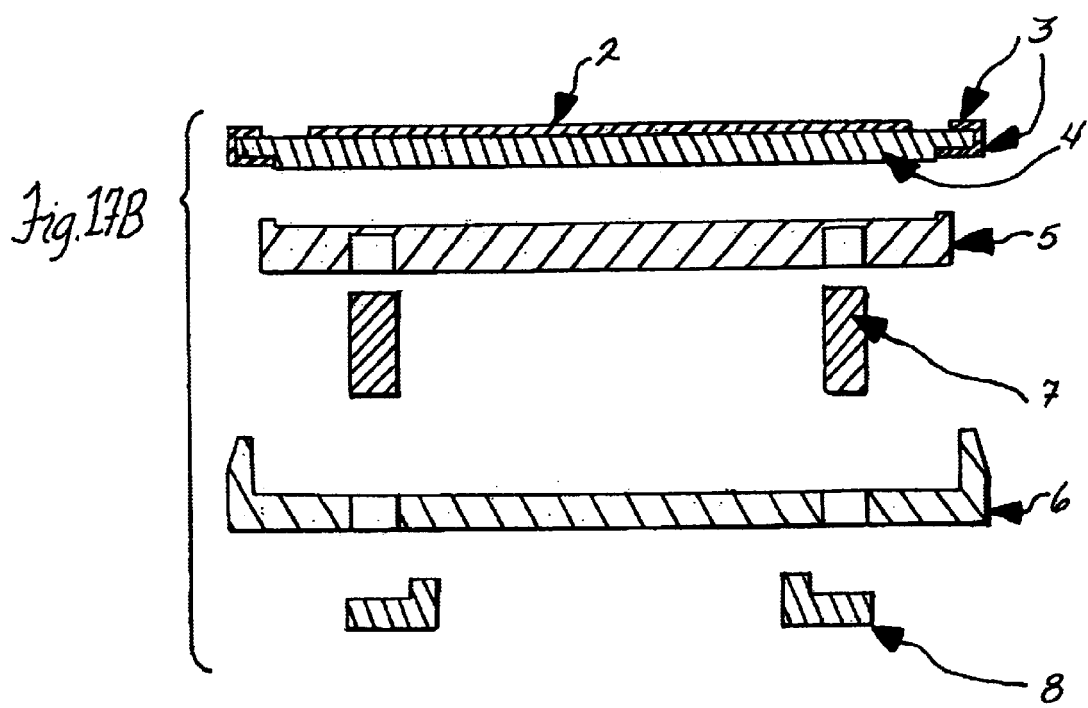

WAFER PROBE STATION

This is a division, of prior application Ser. No. 09/615,454, filed Jul. 13, 2000, now U.S. Pat. No. 6,424,141, which is hereby incorporated herein by reference in its entirety.

BACKGROUND OF THE INVENTION

The present invention relates to an apparatus and method of manufacture for wafer probe station systems and the use of guarding and shielding systems for limiting electrical leakage currents and noise. More particularly, the invention relates to approaches for providing a chuck apparatus system which facilitates guarding and shielding techniques for improving the accuracy of low current and low voltage measurements of a device-under-test (DUT), typically a wafer containing one or more integrated circuits.

Modern wafer probe stations have been developed for making accurate low voltage and low current measurements of semiconductor integrated circuit wafers and other electronic component applications. Wafer probe stations having a guarding system have been developed for reducing current leakage, with Kelvin connection systems and the like to eliminate voltage losses associated with conductive line resistances, and electromagnetic interference (EMI) shielding elements for minimizing the effects of parasitic capacitance and noise in the test environment. The technique of guarding to minimize current leakage during low current measurements, the use of Kelvin connections for low voltage measurements, and the provision of EMI shielding portions are well known and discussed extensively in the technical literature. In guarding applications, in particular, an isolated conductor surrounding or otherwise positioned closely adjacent to low current circuitry, and maintained at the same or nearly the same potential provided as the low current circuit conductors, reduces leakage currents such that the low current measurements may be made accurately. In shielding applications, conductive material connected to ground potential reduce the effects of EMI from external and probe station electronics and other noise on test measurements.

The need to observe device behavior with very low level current and voltage measurements is being driven by the ongoing reduction in the integrated circuit semiconductor device geometry in order to increase circuit density, facilitate higher speeds, and reduce power consumption. Decreasing the scale of the circuit can provide the aforementioned improvements, however, tradeoffs in performance may also occur. A number of factors can adversely affect low level voltage and current measurements, including, impedances in which an impedance or current path unintentionally shares a noise source or other instrumentation, the transfer of a noise voltage through usually coupled incidental inductances, magnetically coupled noise, incidental capacitive coupling, charge transfer due to the proximity of charge bodies to the test circuitry, and the like. These mechanisms often perturb measurements taken in integrated circuit devices requiring very, low level measurements. The measurement of current values in the high attoampere and the low femtoampere regime is particularly difficult in the presence of interfering sources that may be capable of generating current flow of electrons which, though minuscule, may be substantial relative to the very low, voltage and low currents being measured.

In one known approach to providing a guarded and shielded chuck assembly, the assemble includes multiple conductive chuck elements spaced vertically and electrically insulated from each other. The upper chuck element supports the test wafer, and a conductive ring mechanically attached to one of the lower chuck elements surrounds the outer periphery of the chuck assembly to serve as a guard element. In such known assembly, an annular air gap between the chuck assembly elements and the surrounding guard ring serves as a dielectric to isolate the guard ring from the conductive wafer support element. A dielectric material may also be present in the annular gap. The size of the annular space provided in such a design directly affects its dielectric properties and capacitance, and in turn the degree of isolation from the support surface on which testing occurs. However, maintaining the desired registration between the chuck elements and the guard ring in such a design may be difficult. Even slight offsets in the associated mechanical connections between the various elements or in the shape of the guard ring can affect the registration and detrimentally, alter the performance of the chuck.

Another known approach involves use of a chuck assembly in which the wafer support layer is a first conductive material sputtered on the upper surface of an insulator element, which in turn rests stop a second conductive chuck element. An electrically isolated dish has a bottom portion which extends laterally below the second conductive element, and an annular side wall which extends around the outer periphery of the chuck assembly and terminates vertically opposite the insulator element. The dish may be connected as a shield and the second conductive element as a guard. Such an approach may be suitable in certain applications, but does not provide significant guarding around the side periphery of the conductive support surface and the location of testing. In addition, with the annular side wall of the shield opposing the metal sputtered insulator element, parasitic and parallel capacitance may occur between the shield and the conductive test surface and distort test measurements.

It would be desirable therefore to provide an integrated approach to guard and shield systems of wafer probe stations designed to accommodate low level current and voltage measurements with sensitivities in the high attoampere and the low femtoampere regime, which is not easily feasible with presently knows designs of guarding systems or shielding systems in commercial probe stations. The shield and guard system should provide electrical isolation as well as for the reduction of parasitic capacitance and noise experienced by the device under test at the conductive test surface. Excessive hysteresis associated with built up electrical charge at the test surface should also be minimized to reduce the time required for stabilizing measurement voltages to the device under test.

Measurements of low level currents in the high attoampere and low femtoampere regime are particularly susceptible to errors induced by capacitive loading, electrical discharge, and noise events which occur because of the dielectric characteristics of nonconductors in and surrounding the conductive test surface, which effects may significantly distort measurement values and limit the accuracy of low voltage and low current measurements. Poor tester and prober grounding or poorly insulated or guarded probes will contribute to electrical noise from power supplies or external circuits which may enter the probing environment and be coupled to the measurements. Additionally, offsets and drifting associated with parasitic capacitances may result in hysteresis of the current and voltage measurements producing erroneous data offsets, inaccuracies, and long measurement times. Advantageously, it would be desirable to provide an integrated approach which brings the overall wafer probe station and chuck design into cooperative relationship for both guarding and shielding for the reduction of parasitics and noise and which also minimizes the effects of capacitance in the overall system.

SUMMARY OF THE INVENTION

The present invention addresses the problems associated with prior art probe stations by providing an integrated guarding and shielding approach for limiting electrical leakage currents and noise. The guarding and shielding system provides a line-of-sight electrical barrier between a shielding element and the conductive wafer support layer to both minimize leakage currents, parasitic capacitance, electromagnetic interference (EMI) and other noise sources.

Briefly summarized, the invention relates to a chuck apparatus that may be used for both room ambient and thermal probing applications for a wafer probe station in which an upper conductive layer for supporting the DUT is electrically isolated from a lower conductive chuck element by an insulator which positions the upper conductor layer above the lower chuck element and also positions an electrically isolated conductor along its periphery. A further conductive laterally extending element is provided as a shielding element wherein one or more of the lower chuck element and the peripheral conductor form an electrical barrier between the conductive test surface and the shielding element. Alternatively, the shielding element may also be connected as a guard and conductive surfaces of the probe station chassis used as a shield. Various other guarding and shielding approaches are also made possible with the novel chuck apparatus of the invention.

The shielding and guarding approaches described in accordance with one embodiment of the invention provides for the use of a lower chuck element in the form of an aluminum alloy disk or puck with cast-in heating and cooling elements and temperature sensors. In another embodiment, the lower chuck element is a metal coated ceramic disk with case-in heating and cooling elements and sensors. The temperature control elements may be omitted for room ambient applications.

The insulator supported on the lower chuck element may be provided in various geometric configurations to permit a number of arrangements of the conductive test layer, the peripheral conductive element and the lower chuck element relative to each other. The unique design is mechanically rigid, ensures proper registration of the various components over time, and provides improved performance in low voltage and low noise applications. The novel chuck assembly of the invention may be arranged in a variety of electrical connection schemes with the test instrumentation and with the probe station chassis.

BRIEF DESCRIPTION OF THE DRAWINGS

The novel features believed characteristic of the invention are set forth in the appended claims. The preferred mode of use, further objectives and advantages thereof, is best understood by reference to the following detailed description of the embodiments in conjunction with the accompanying drawings, wherein:

FIGS. 4–10 are cross-sectional schematics of other embodiments of a chuck apparatus in accordance with the invention, and FIGS. 4A–10A are top plan views for the chuck apparatuses of FIGS. 4–10, respectively;

FIG. 15 illustrates a cross-sectional schematic of another chuck apparatus in which an electrically isolated conductor is provided along the outer side periphery and bottom surface of the chuck insulator element, and FIG. 15A illustrates a top plan view of the chuck of FIG. 15.

FIG. 17 is a cross-sectional schematic of another embodiment of a chuck apparatus in accordance with the invention in which an isolated conductive element extends along the upper, side and bottom surface of the insulator at its periphery.

FIG. 17A illustrates a top plan view of the chuck of FIG. 17, and

FIG. 17B illustrates an exploded cross-sectional schematic thereof.

DETAILED DESCRIPTION OF THE PREFERRED EMBODIMENTS

Figure 1:
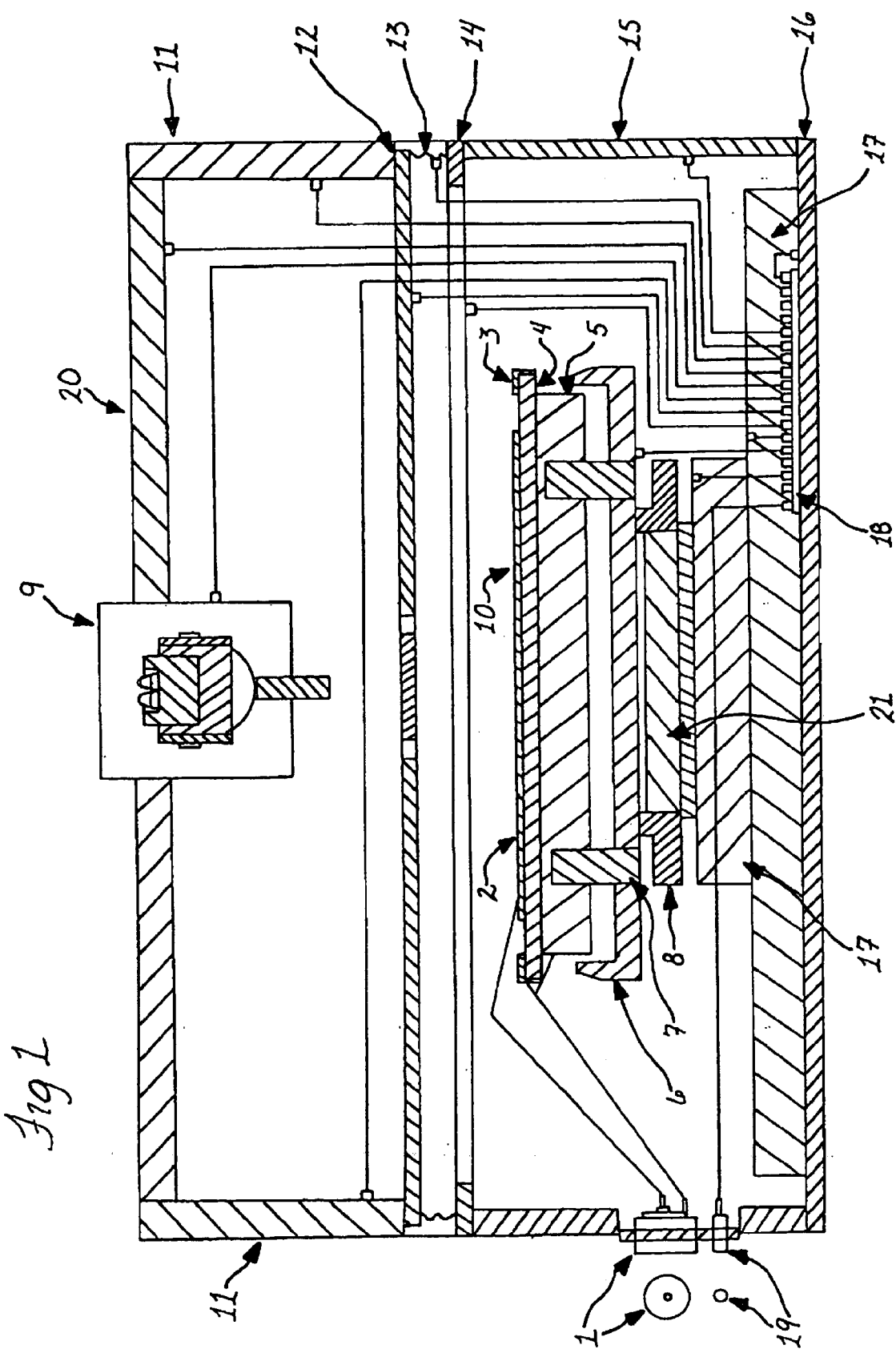
FIG. 1 illustrates a cross-sectional schematic of an embodiment of a chuck apparatus in a wafer probe station environment in accordance with the invention.
Figure 1A:
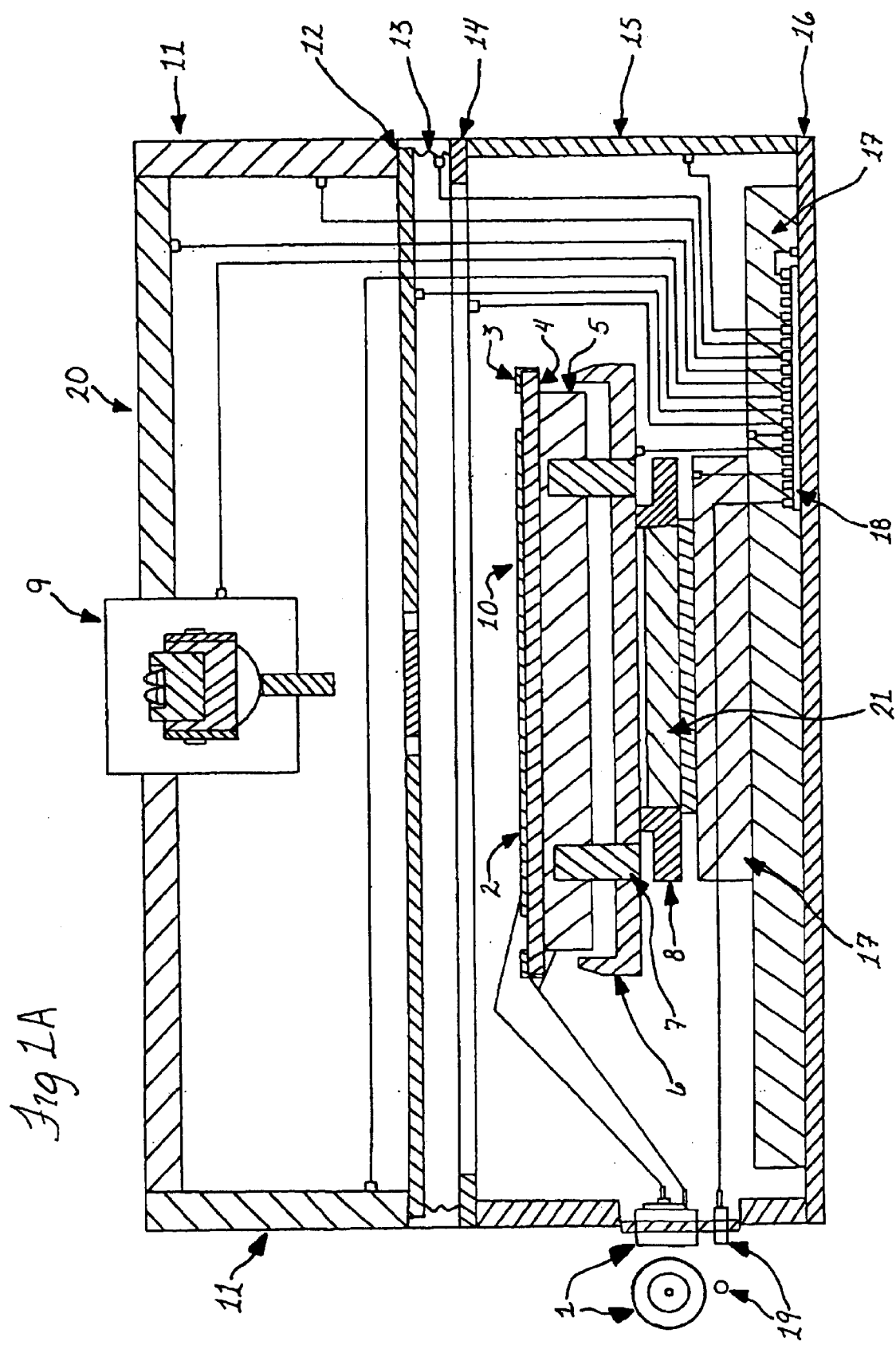
FIG. 1A shows a cross-sectional schematic of the chuck apparatus and probe station of FIG. 1 with an alternate electrical scheme.

With reference to FIG. 1, a wafer probe station embodiment is shown in which a chuck apparatus 10 is supported within a probe station chassis. The chuck apparatus supports a wafer or other semiconductor integrated circuit device under test (DUT). The chuck apparatus 10 may be independently moved along X and Y axes using a positioner (not shown), which controls the X and Y components of the stage 17. The chuck apparatus 10 is positioned on a hub 21, which is attached to the X/Y stage construction 17 of the wafer probe station. As shown, a coaxial connection 1 is indicated for electrical signals being provided to the wafer probe station. Another connection 19 is provided to facilitate grounding of the probe station chassis by means of central point ground 18. As shown in FIG. 1A, a triaxial connection implementation may also be provided for the electrical signals, e.g., force, guard, and sense, that are applied at the wafer probe station to facilitate grounding of triaxial cable used to connect test instrumentation.

As illustrated, a microscope 9 is provided with a mount and X/Y/Z drive mechanisms on a microscope bridge 20 for positioning over the chuck apparatus 10, with microscope bridge supports 11 supporting the microscope bridge. A platen 12 is provided for supporting manipulators (not shown) for electrical probes, which can be maneuvered to make electrical contact at a desired location of the device under test on the chuck apparatus 10. The probes may also be provided in the form of a probe card inserted in the central opening of the platen, as is known in the art. The platen 12 is supported above a baseplate 14 on a mechanism which permits the platen to be moved vertically. Moving the platen in the vertical direction permits point contact to be made between each test probe and the DUT. A flexible bellows 13 extends from the base plate 14 to the platen 12 along the sides and front of the probe station chassis to provide a temperature, humidity, and light barrier for maintaining the desired environmental conditions for the DUT. As shown, the bellows 13 is provided with a conductive lining, such as a copper mesh lining which may be electrically connected to the central point ground 18. The central point ground 18 provides a central point for all significant probe station elements to be grounded to a single point to reduce measurement noise in the wafer probe station. Thus, as shown, each of the conductive components of the probe station may be grounded by connection to the central joint ground 18. The probe station base plate 14 is supported by opposite side legs 15, and a bottom cover 16 extends laterally between the side legs to complete the lower chassis of the robe station. In the embodiment shown in FIG. 1 an external ground connection 19 is provided for grounding external elements by connection to the central ground point 18. A coaxial connector 1 provides two isolated connections to components of the chuck apparatus 10. In the alternative embodiment of FIG. 1A, the connector 1 may be a triaxial connector and the outer conductor of a triaxial cable also connected thereby to the central point ground 18.

The construction of the chuck apparatus 10 will be described further in connection with the embodiments discussed below, which advantageously provide for accurate registration and alignment between the conductor and insulator elements that facilitate the low noise characteristics of the chuck apparatus 10. To this end, the method of manufacture discussed below provides for disposing a central conductive surface atop an insulative plate, and positioning an electrically isolated conductor along the periphery of the insulative plate so as to leave a portion of uncoated insulator material between the two deposited conductive regions. Thus formed, the central conductive surface resides on the insulative plate with the electrically isolated peripheral conductor being spaced from the central conductive surface, facilitating permanent accurate registration between the conductive elements, as discussed further below.

With reference to FIGS. 1–10A and 15–17B, with like reference numerals indicating structures of the thermal chuck apparatus 10 that are common between the embodiments, a triaxial connector 1 is provided for connecting the wafer probe station to external instrumentation. A coaxial connection may be substituted for the triaxial connector and the chassis ground being provided with a separate ground strap as shown in FIG. 1. As illustrated, a first conductive element 2 is deposited on an electrical insulator element 4, such as a ceramic material, by plasma discharge sputtering, electroplating or other suitable technique. The first conductive element supports the wafer for testing. The insulator element 4 is supported, on a second conductive element 5, which may comprise an aluminum alloy disk-shaped element with cast in heating and cooling elements and temperature sensors. The heating elements are provided as electric resistive heaters, and the cooling elements comprise metal tubes connected to a source of liquid or vapor coolant. The temperature sensors are connected to a temperature controller which monitors and controls the temperature by control of heating and cooling elements. In such a thermal chuck, the insulator 4 should be a good thermal conductor to transfer heat from the heated conductive element 5 to the test surface. The conductive element 5 may alternatively be a ceramic disk with cast in heating, cooling, and temperature sensor elements, and a metalized outer surface.

A third conductive element 6 has a bottom portion which extends laterally below the second conductive element 5, and an annular side wall which extends opposite the outer periphery of the second conductive element. FIG. 3A, for example, shows the top plan view of the thermal chuck apparatus of FIG. 3, illustrating the concentric third conductive element 6 opposing the second conductive element 5 of the chuck apparatus.

The element 6 is provided with insulative supports 7 for supporting the second conductive element 5 above the laterally extending bottom portion of element 6. The supports 7 may be sapphire rods extending into corresponding bores in the conductive elements 5 and 6, as shown. The bores in element 5 preferably extend to within 0.020–0.060 inches from the top surface of element 5. This has been found to minimize the amount of vertical expansion associated with temperature variations of conductive element 5. A dielectric material may also be provided in the space between conductive elements 5 and 6 if desired. The chuck apparatus is connected to an insulated hub adaptor 8 for connection with the hub 21. Referring to FIG. 1A, the hub 21 attaches the chuck apparatus to the X, Y stage assembly 17 to facilitate movement of the chuck apparatus in the X and Y lateral directions. The hub is connected in a manner that permits it to rotate in order to align the chuck apparatus and test wafer as desired.

Figure 3:
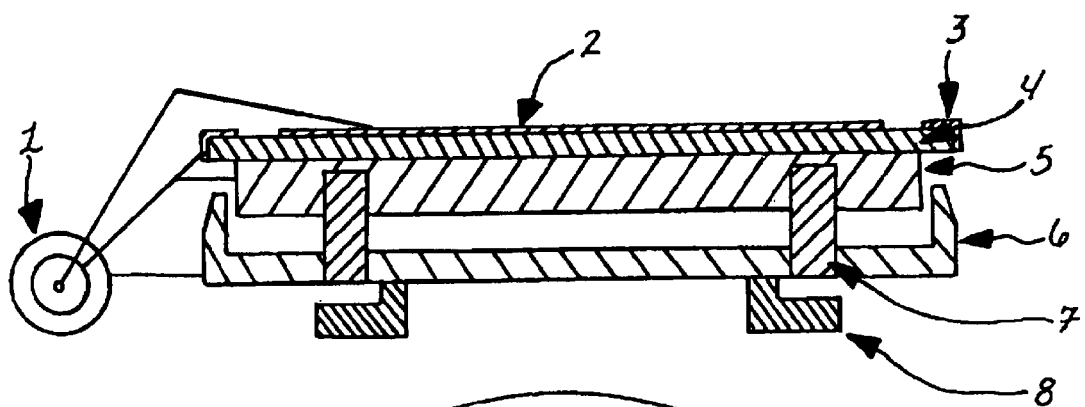
FIG. 3 shows an enlarged cross-sectional schematic of the chuck apparatus of the wafer probe station of FIGS. 1 and 1A in which a further isolated conductive element extends along the periphery of the insulator.
Figure 3A:
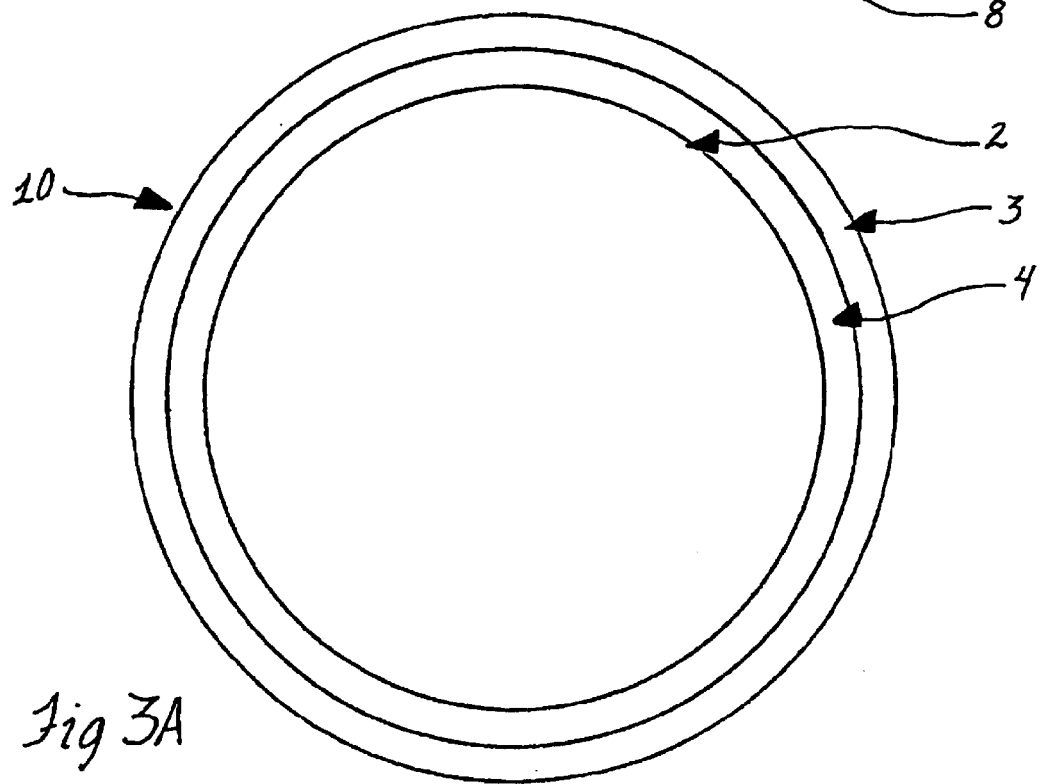
FIG. 3A is a top plan view, of the chuck apparatus of the wafer probe station of FIGS. 1 and 1A.

With specific reference to FIG. 3, which shows an enlarged view of the chuck apparatus of FIGS. 1 and 1A, improved measurement capabilities are provided by connecting the center conductor of triaxial connector 1 to the first conductive element 2, and connecting the middle conductor of the triaxial connector as a guard connection to element 3, and also to an isolated conductor 3 spaced from the second conductive element 5. The test surface is the centrally located conductive element 2 for supporting the DUT. The diameter of the test surface is dictated by the size of the wafers to be tested. Typical wafer size may be 8 inches in diameter, although the chuck may be sized to accommodate any other wafer size, such as 25 mm–300 mm wafers and semiconductor integrated circuits. Also, while the invention is described with reference to a chuck having a circular cross-section, chucks and the associated insulator and conductive elements of other geometries, e.g., square, rectangular, oval, etc., may be constructed in accordance with the invention.

In the embodiment of FIG. 3, the insulator 4 positions the first conductive element 2 above the second conductive element 5. A fourth electrically isolated conductor 3 is also disposed on the insulator. As shown in the plan view of FIG. 3A, the first conductive element 2 is positioned centrally and the electrically isolated conductor 3 forms a concentric ring about the conductive element 2 with an insulative region therebetween. The center conductive element 2 preferably comprises a metal deposited on the top surface of the insulator 4 where the semiconductor integrated circuit device DUT may be placed. The conductive element 3 is also a deposited metal which, as illustrated, forms an interruption in the metal coating to provide for an insulative barrier between the conductive element 2 and the conductor 3. The fourth conductive element 3 also has a side portion which extends around the outer periphery of insulator element 4. Preferably, the conductive element 3 extends down along the entire periphery of insulator element 4, as shown, but it is also possible to terminate the conductive material at a location on the periphery above the bottom edge of the insulator.

The diameter of insulator element 4 is larger than that of the second conductive element 5 to provide a greater insulative barrier between the conductor element 3 and conductive element 2 in the radial or horizontal direction. Preferable the amount of insulation provided between the conductors 2 and 3 radially is greater than or equal to the bulk thickness of the insulator 4. In other words, the concentric gap between the conductive element 2 and the isolated fourth conductive element 3 is preferably greater than or equal to the thickness of the insulator 4 to minimize electrical leakage or conductance in the low femtoampere and high attoampere regime. The diameter of the conductive element 2 is typically that of the largest test wafer to be tested. For example, for an 8-inch wafer and a conductive element 3 that extends radically 0.025 inches on an insulator that is 0.312 inches thick, the overall diameter of the chucks insulator 4 should extend at least approximately 8.674 inches (8"+2×0.312"+2×0.025"). The conductive element 5 is preferably of larger diameter than the wafer diameter so that the effects of thermal losses to the atmosphere at the peripheral edge of the element 5 are moved away from and therefore minimized at the test wafer, and improved proper temperature control and uniformity are achieved.

The thickness of the metal deposited on conductive elements 2 and 3 is such as to make good ohmic contact for the application of test signals in the case of the center conductor 2 in contact with the DUT, and to ensure a very low sheet resistance value for the counter conductor 2 and the fourth conductive element 3. Therefore, the coatings may be as thin as 1 micron, or thicker without significant change in overall performance in order to accommodate thermal expansion associated with the thermal chuck apparatus for operation over a temperature range of, e.g., −65 to +400° C., or beyond.

In the arrangement shown in FIG. 3, the outer conductor of the triaxial connector 1 is coupled to the third conductive element 6 and grounded for providing electromagnetic interference (EMI) shielding of the conductor 2 supporting the DUT and second conductive element 5. In this arrangement, the conductive components of the probe station chassis may provide shielding from noise sources external to the probe station, and the third conductive element 6 may provide shielding from noise sources internal and external to the probe station, including noise from positioning motors for the X, Y stage assembly and other internal electronic devices. The second conductive element 5 and the ring-shaped conductive element 3 are connected via the middle conductor of the triaxial connector 1 as a guard to provide a barrier between the test surface and the shield elements and to minimize leakage currents at the test surface.

Accordingly, the chuck apparatus 10 of FIG. 3 includes a center conductive element 2 for supporting the DUT, a lower conductive element 5, and an intervening insulator 4 for positioning the conductive element 2 above the conductive element 5. The electrically isolated conductor 3 is provided as a horizontally extending ring concentric as with the first conductive element 2, and may also extend vertically along the outer lateral edge of the chuck insulator 4. A further isolated conductive element 6 is provided below conductive element 5 and has a portion extending vertically around the side periphery of the conductive element 5. The first conductive element 2 and the insulator 4 are circular, and the insulator 4 has a diameter greater than the diameter of the first conductive element 2 and that of conductive element 3. In this arrangement, the combination of the conductive elements 3 and 5 provide line-of-sight guarding between the conductive element 2 and the conductive element 6 to minimize current leakage from the element 2 and the DUT which it supports. The guard elements also provide an electrical barrier to minimize stray capacitance and noise in the chuck apparatus. The larger diameter of the upper chuck insulator 4 provides for proper isolation between the center conductive element 2 and the guard conductive element 3. The conductive element 3 facilitates additional guarding around the side periphery of the conductive test areas and provides an electrical barrier between the test area and conductive components of the probe station to the side of the test area. Thus, in this embodiment, the vertical sidewall of conductive element 6 may extend further upward than shown in FIG. 3 toward the test surface because the guard conductor 3 reduces the capacitive effects between the test surface and the side wall of element 6.

As should be apparent, the conductive elements 2 and 3 are fixed relative to each other such that the desired concentric registration between these elements is always maintained after assemble. Proper spacing of the conductive element 2 and the conductive element 5 is likewise maintained by the solid insulator 4. Accordingly, the desired isolation, capacitance and thermal characteristics designed into the chuck apparatus by selection of materials and dimensions are maintained throughout the life of the chuck.

Figure 5:
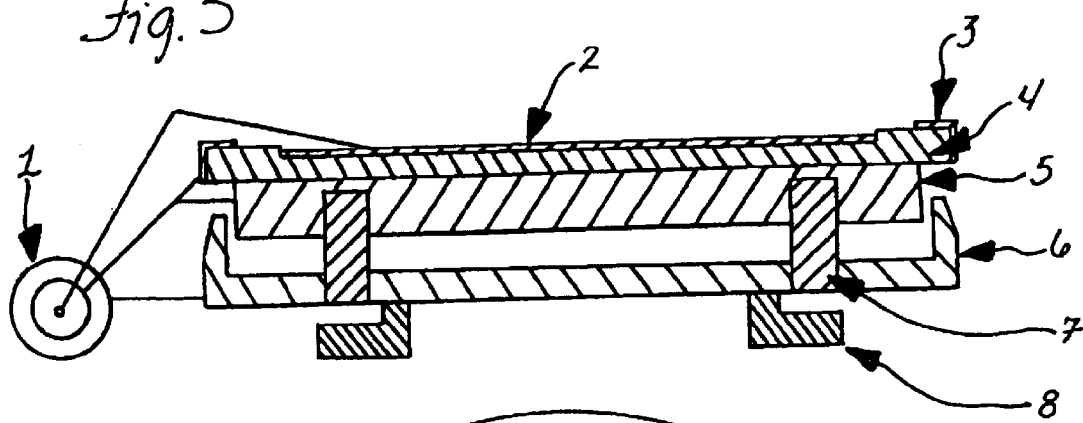
Figure 5A:
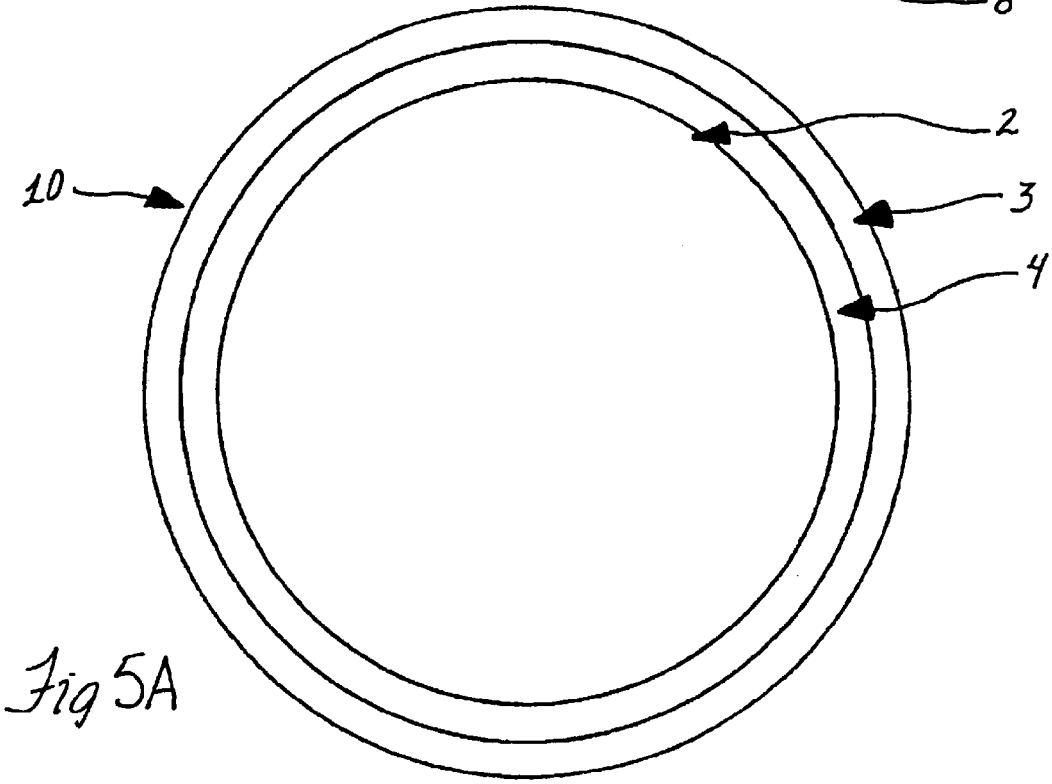
Figure 6:
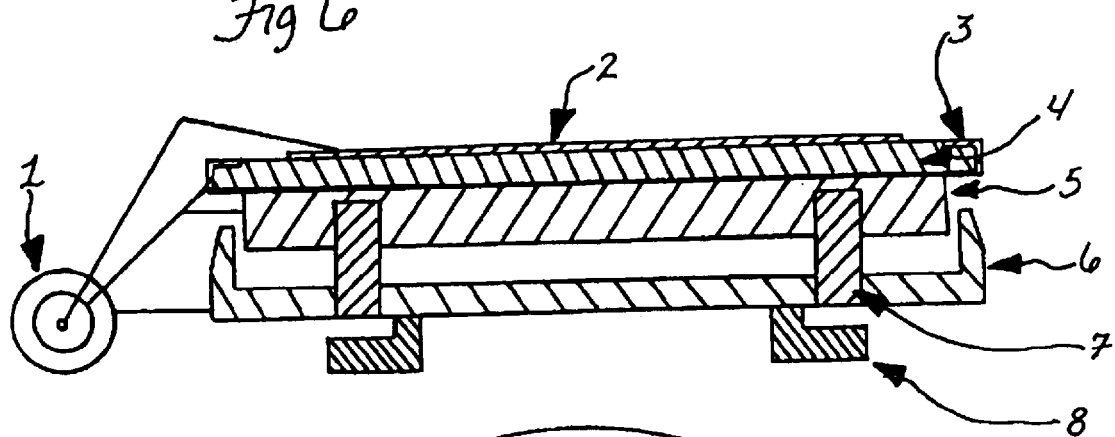
Figure 6A:
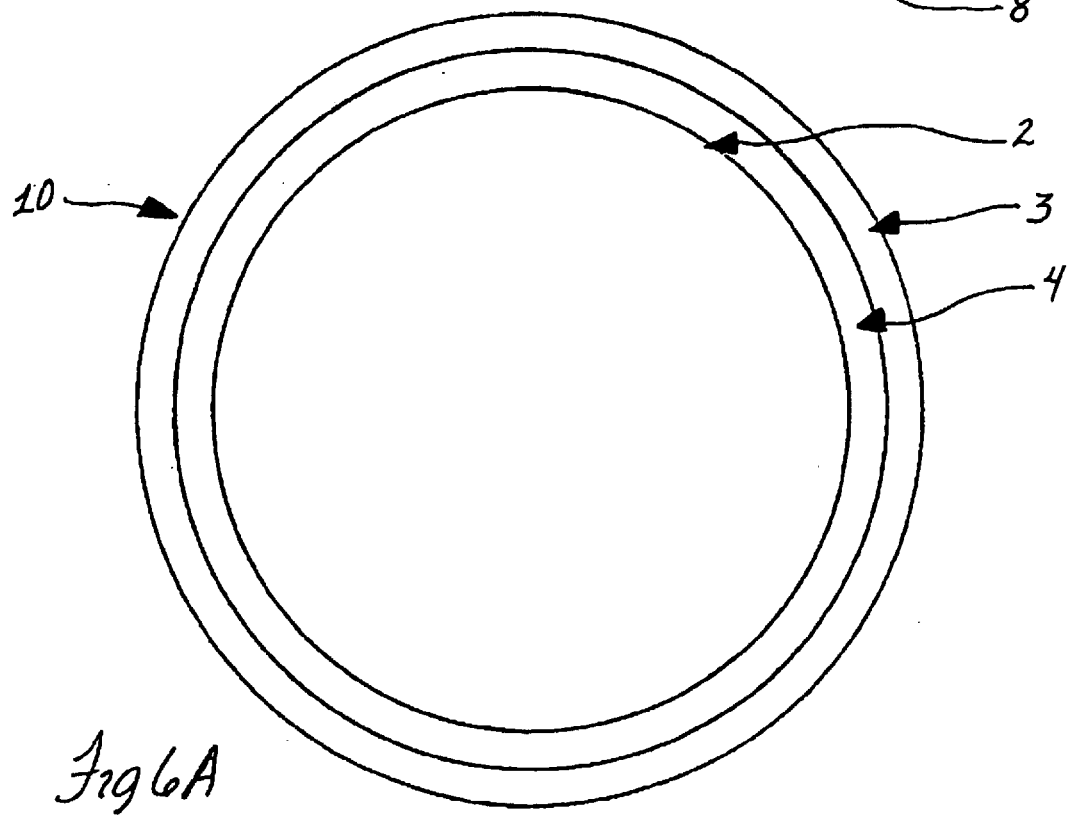

In FIGS. 4, 5, and 6, embodiments are illustrated for positive relief and negative relief metalized surfaces on the chuck insulator 4 for providing the deposited center conductive element 2 and/or the electrically isolated conductive element 3. In FIG. 4, there is illustrated a positive relief on the surface of the insulator 4 which separates conductive elements 2 and 3, essentially placing the ceramic insulator material between she conductive elements. The conductive element 2 is disposed in a central recess formed in the insulator and the conductive element 3 is disposed in a peripheral groove in the insulator. Such an arrangement provides a more sleek product appearance without adversely affecting the performance of the chuck, and has other benefits in terms of manufacturing and/or mechanical integrity. Providing the ceramic insulator around the side periphery of the conductive element 2 also improves the temperature uniformity of the chuck apparatus compared to the embodiment of FIG. 3 by reducing thermal losses to the atmosphere at the edge of the element 2.

In the embodiment of FIG. 5, a central recess is provided in the insulator 4, which allows the center conductive element 2 to be positioned slightly below the horizontally extending portion of the fourth conductive element 3, and also below the upper surface of insulator 4. Such an arrangement enhances the effectiveness of conductive element 3 in guarding the test surface in a direction above and to the side of the outer periphery of the test surface, and may also improve thermal uniformity. In the embodiment of FIG. 6, the conductive ring is recessed in a groove extending around the circumference of insulator 4 such that the horizontal portion of element 3 and the upper surface of the insulator lie in a horizontal plane below the center conductive element 2. This arrangement enhances guarding of the test surface in a direction below and to the side of the outer periphery of the test surface.

In the embodiments shown in FIGS. 7–10, the insulator 4 and conductive element 5 of the chuck apparatus have approximately the same diameter, which is larger than the diameter of the center conductive element 2. The approach of FIGS. 7–10 thus provides greater thermal uniformity across the conductive element 2 and DUT compared to embodiments of FIGS. 3–6. This is because heated conductive element 5 more effectively heats the outer periphery of insulator 4 and thereby minimizes edge thermal losses from conductive element 2. With both the insulator 4 and conductive element 5 of larger diameter than the center conduit element 2, such edge effects are also moved away from the conductive element 2 and DUT. In all other respects, the embodiment of FIG. 7 corresponds to FIG. 3. As illustrated, both FIG. 3 and FIG. 7 show the surface of the chuck insulator 4 with separated metal layers 2 and 3 providing the center conductive element 2 and electrically isolated conductor 3, respectively. With reference to FIGS. 8–10, positive and negative relief for the deposited metal are provided in a fashion which corresponds to FIGS. 4–6, respectively.

Figure 2:
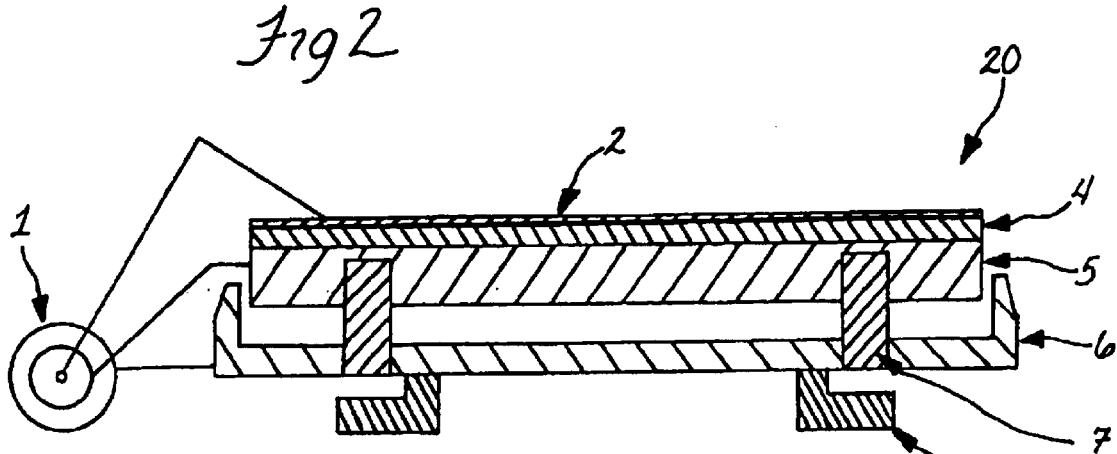
FIG. 2 shows a cross-sectional schematic of a probe station chuck with a conductive testing surface isolated from a lower conductive element by an insulator, and a further isolated conductive element having a laterally extending portion and a portion extending vertically opposite the side periphery of the lower conductive element.
Figure 2A:
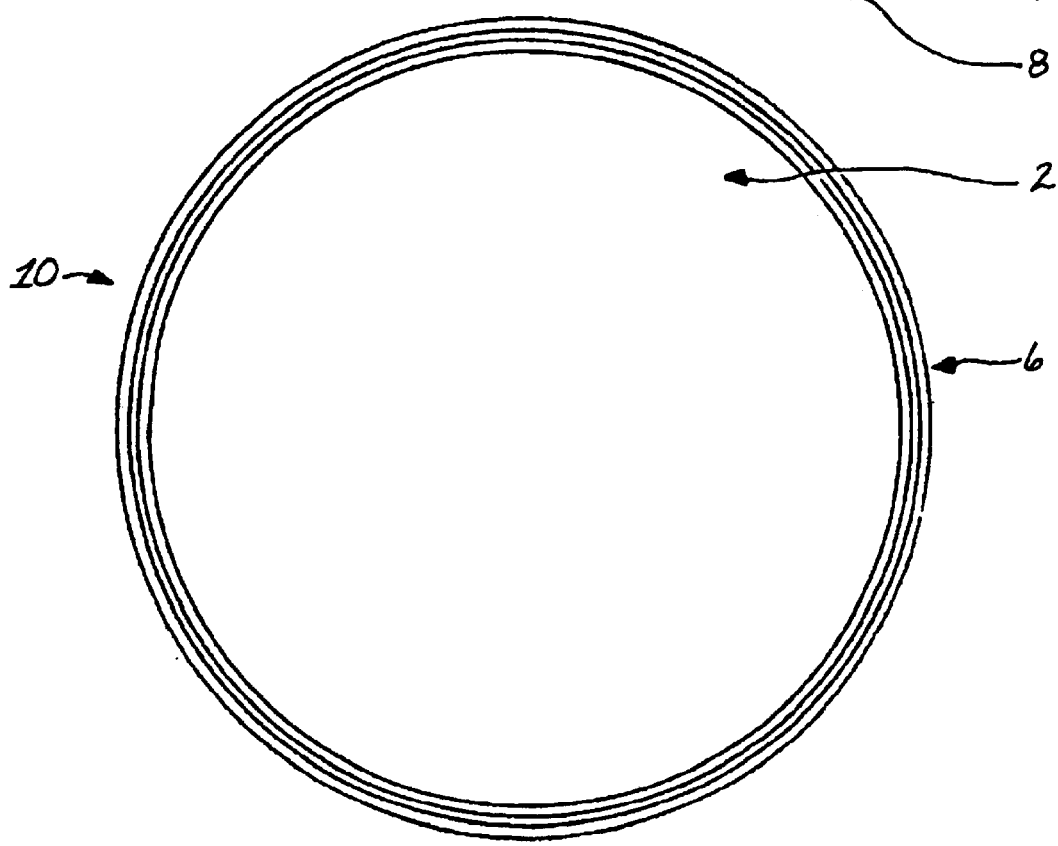
FIG. 2A is a top plan view of the chuck embodiment of FIG. 2 illustrating the vertical side wall of the further isolated conductive element concentric with the center test surface.

FIGS. 2 and 2A illustrate embodiments in which the conductive element 3 is omitted, and the center conductive element 2 extends over the entire upper surface area of the insulator 4. The side wall portion of the third conductive element 6 terminates vertically at a location below the insulator element 4, and also below the first conductive element 2. Thus, the element 6 does not approach the vicinity of the test surface or the DUT. In the preferred embodiment, the side wall terminates at least 5–10 mm below the test surface. The apparatus constructed in this manner may be arranged with the center conductor of a triaxial cable connected to the center conductive element 2, the middle conductor connected to element 5 as a guard, and the outer conductor and element 6 connected to ground as a shield. Arranged in this manner, the element 5 thus provides a line-of-sight guard barrier between at least a majority of the test surface and the shield element 6 to facilitate low noise measurements. Also, the effects of parallel and parasitic capacitance between the conductive elements 6 and 2 are reduced because the vertical side wall of the conductive element 6 does not oppose the conductive element 2. This approach is also suitable for making low noise and low current measurements.

Figure 11A:
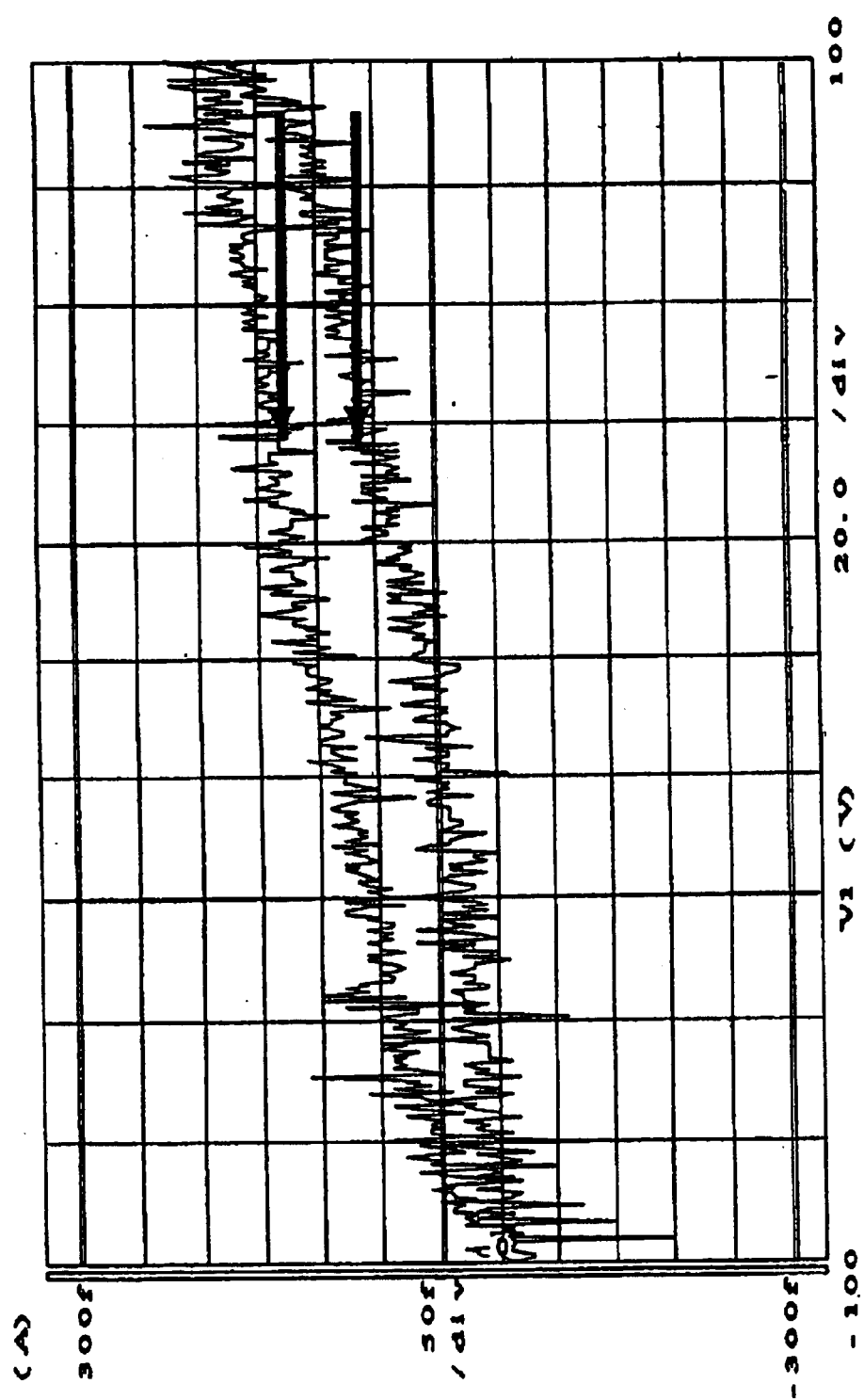
FIGS. 11A and 11B are graphs showing the hysteresis of leakage measurements associated with the chuck apparatus of FIG. 2 and FIG. 3, respectively.
Figure 11B:
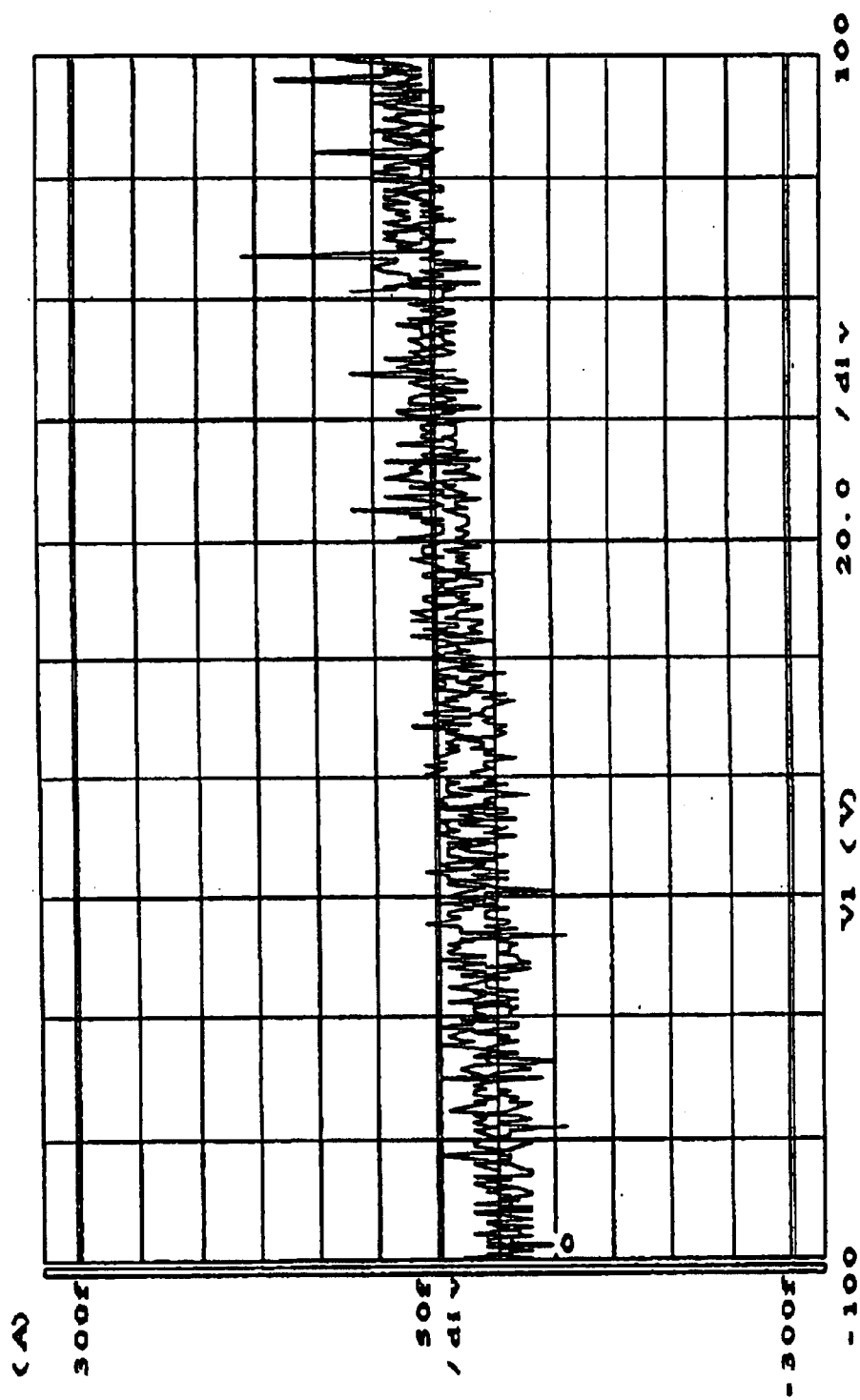

Experimental tests ere performed for comparing operational characteristics of the thermal chuck apparatus of FIGS. 2 and 3 to illustrate the advantages of incorporating the electrically isolated conductor 3 with the conductive element 5 so as to provide an improved line-of-sight electrical barrier between the center conductive element 2 and the laterally extending conductive element 6. FIGS. 11A and 11B are graphs showing the hysteresis of leakage measurements associated with the chuck apparatus of FIG. 2 and FIG. 3, respectively. A voltage applied to the center conductive element 2 was swept from −100 v to 100 v and back, and the leakage current was measured using an HP4156 parametric analyzer. Thus, in FIG. 11A, the lower curve indicates the leakage currents measured as voltage at the test surface is increased; whereas the upper curve illustrates an elevated leakage current associated with hysteresis in the chuck caused by parasitic capacitances. There is measurable hysteresis in the raised chuck assembly of FIG. 2, i.e., between 50 and 100 femtoamperes, as illustrated by the vertical gap between the two arrows in FIG. 11A. This hysteresis value is substantially improved relative to previous designs where the shield element extended vertically near the test surface, indicating that system capacitance has been reduced. In FIG. 11B, on the other hand, there is little or no hysteresis illustrated in the chuck apparatus of FIG. 3. This demonstrates the effectiveness of the line of sight guarding of conductive element 3 between the test surface and the shield element 6. This additional guarding has reduced the current leakage and effective capacitance even further, as shown by the reduced hysteresis and the reduced slope of the curves in FIG. 11B.

Figure 12A:
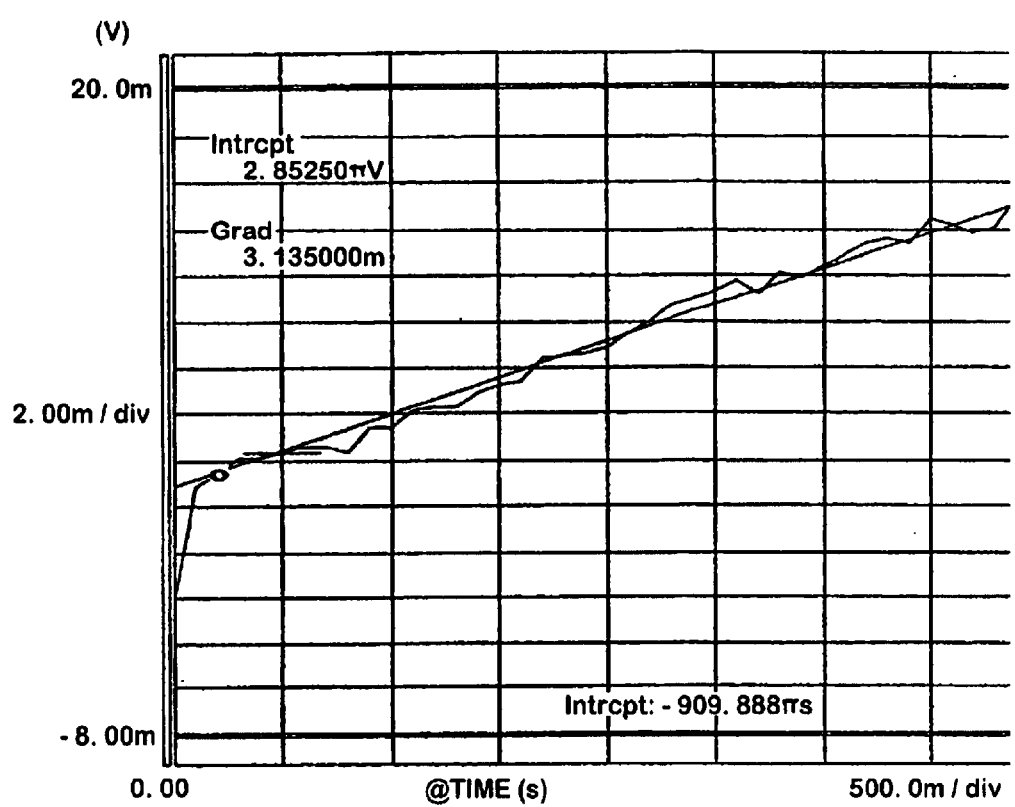
FIGS. 12A and 12B graphically illustrate the capacitance measurements associated with the chuck apparatus of FIG. 2 and FIG. 3, respectively.
Figure 12B:
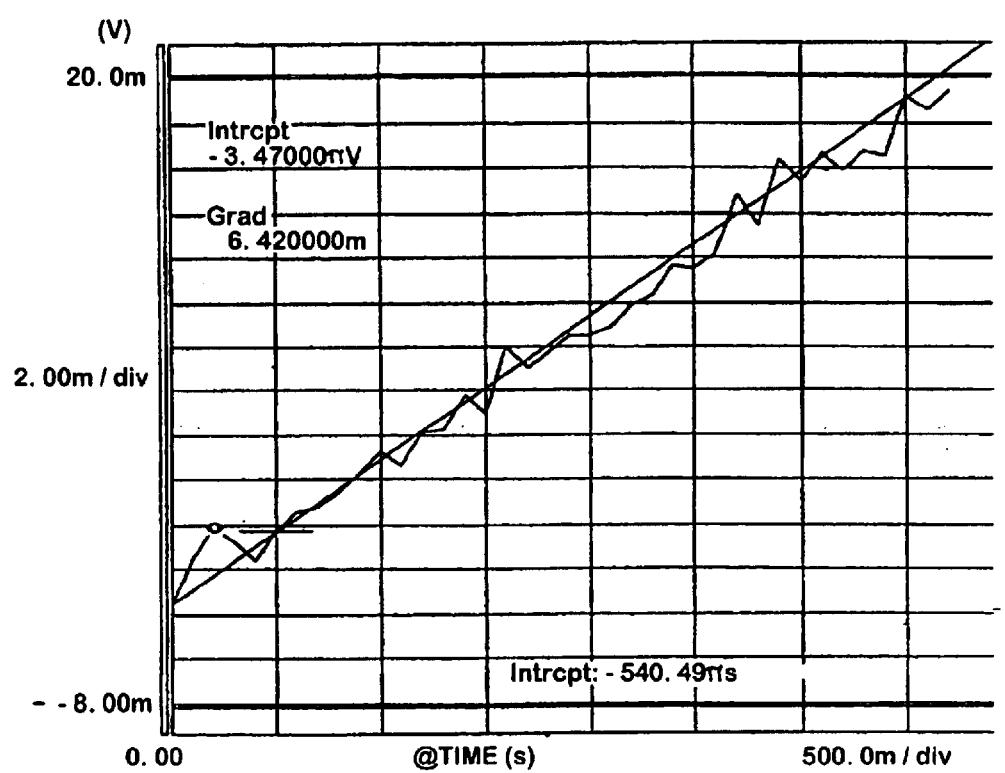

FIGS. 12A and 12B graphically illustrate the capacitance measurements associated with the chuck apparatus of FIG. 2 and FIG. 3, respectively. Capacitance is inversely proportional to the distance between adjacent conductors, or the thickness of the insulators in this case. The embodiment of FIG. 2 was tested using a ceramic plate insulator 4 of approximately 0.312 inches thick. Measured separately the plate's ceramic capacitance was approximately 320 to 360 picofarads. In FIG. 12A, with the chuck having this native capacitance of 320–360 pF, a stray capacitance of only 15–16 pF was observed with the chuck apparatus of FIG. 2, indicating that the system capacitance has been reduced by increasing the distance between the test surface and the conductive element 6 and due to the intervening guard element 5. Significantly, in FIG. 12B the same test measured only a 7 to 9 picofarad stray capacitance associated with the embodiment of FIG. 3, a substantially improved measurement. This was achieved using an insulator 0.187 inches thick with a native capacitance of about 530 pf. This significant reduction to only 7–8 picofarad stray capacitance is associated with the provision of the isolated conductive element 3 connected as a guard.

Figure 13A:
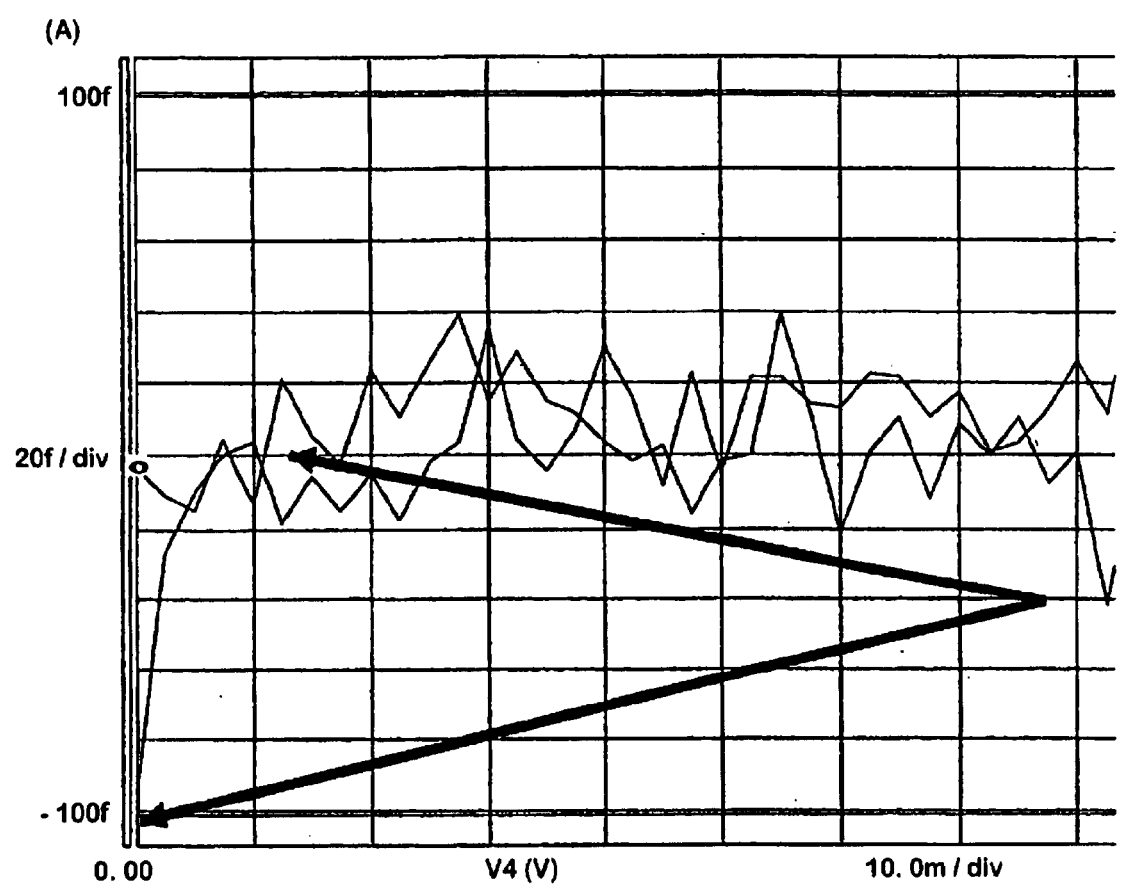
FIGS. 13A and 13B graphically illustrate the settling times associated with measurements performed with the chuck apparatus of FIG. 2 and FIG. 3, respectively.
Figure 13B:
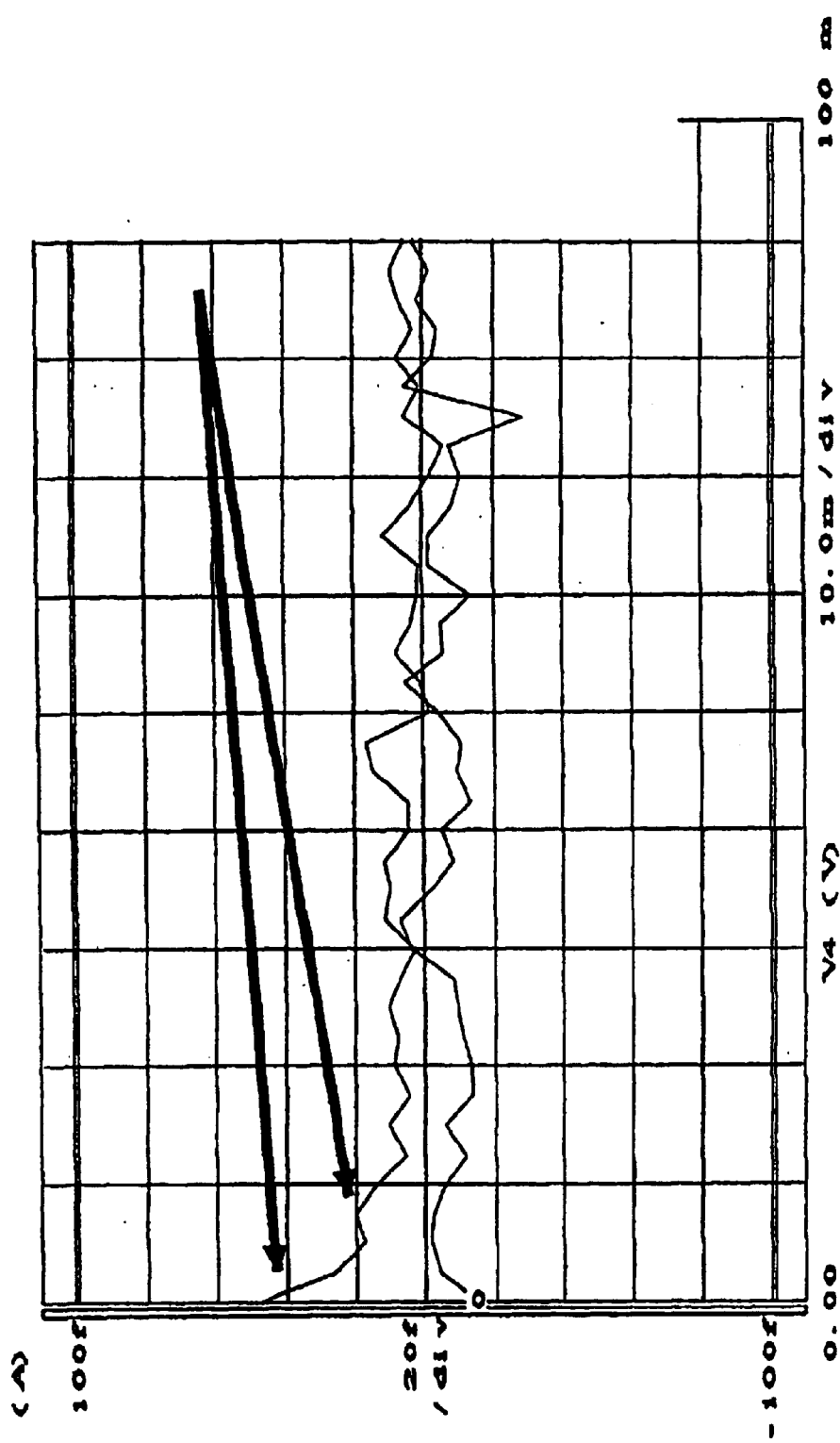

FIGS. 13A and 13B graphically illustrate the settling times associated with the system capacitance of the chuck apparatus of FIG. 2 and FIG. 3, respectively. The settling time represents the time necessary to dissipate stray currents at the test surface. Each figure shows the measured noise at the test surface at 0 applied voltage (Curve 1) and at a predetermined applied voltage (Curve 2). FIG. 13A illustrates a settling time of approximately 5 seconds for the chuck of FIG. 2, but there is some appreciable noise beyond 5 seconds. There necessarily will be some settling time due to the high electrical isolation of the upper chuck insulator 4, and the capacitance of the system which is associated with a resistive capacitive (RC) time constant. The measurable charging current represented by the vertical distance between the two points indicated by the arrows is due to the system's capacitive effects when a voltage is applied. The relative short time for this current to dissipate indicates that capacitance effects were reduced. FIG. 13B illustrates that the chuck apparatus of FIG. 3 also settles within about 5 seconds. Curve 1 was generated at 0 voltage and Curve 2 was measured at an applied voltage. The charging current represented by the arrows at Curve 2 associated with the system capacitance is significantly reduced. The noise associated with the design of FIG. 3 was also considerably less, as shown by the relative flatness of the curves.

Figure 14A:
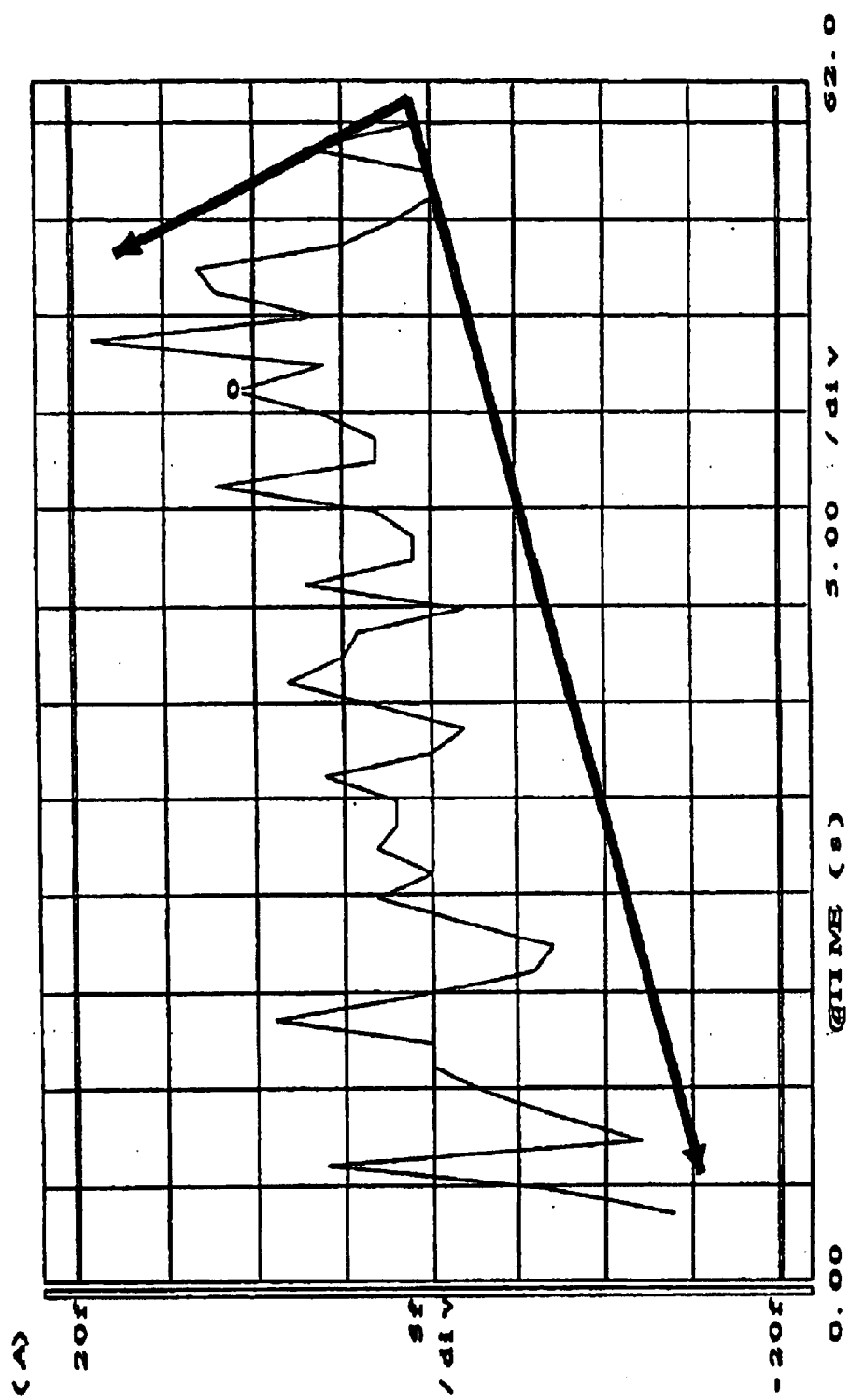
FIGS. 14A and 14B graphically show the noise measurements associated with the chuck apparatus of FIG. 2 and FIG. 3, respectively.
Figure 14B:
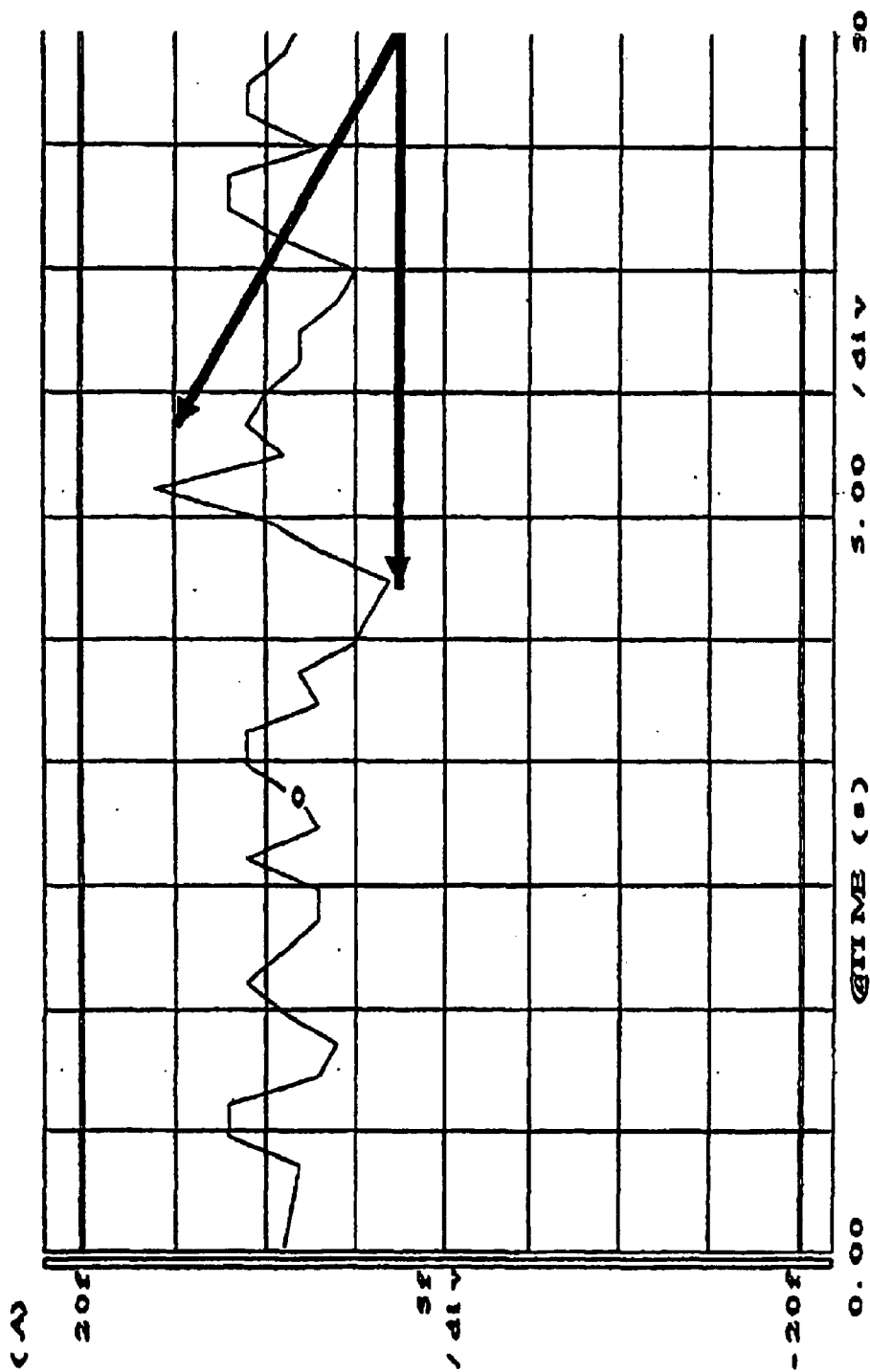

FIGS. 14A and 14B graphically illustrate the noise measurements associated with the chuck apparatus of FIG. 2 and FIG. 3, on a more narrow scale. In FIG. 14A, the graph illustrates the noise characteristics associated with the embodiment of FIG. 2. The upward slope of the curve between the points designated by the arrows is an indication that some settling is still occurring after 5 seconds. FIG. 14B illustrates that the embodiment of FIG. 3 demonstrated lower settling time with a maximum of 10 femtoamperes of noise with electrical isolation in the ceramic insulator 4 of approximately 1 teraohm. Except for the portion of the curve between the arrows, the noise curve is relatively flat and constant. The noise associated with the design of FIG. 2 without the guard ring 3 was somewhat higher, but still acceptable for achieving low noise measurements.

The prototype associated with the embodiment of FIG. 3 utilized a chuck insulator of approximately 0.187 inches thickness, capacitance of approximately 550 picofarads, and electrical insulation of about 1 teraohm at 500 VDC. The ceramic plate insulator of the prototype of the design of FIG. 2 was approximately 0.312 inches thick with less capacitance, e.g., 340 picofarads and electrical insulation significantly greater at 10 teraohms. Advantageously, in both designs substantial isolation of the test surface and low parasitic capacitance has been demonstrated. By providing in the embodiment of FIG. 3 a guarding system including metal ring deposited on the periphery of an insulator and a conductive element below the insulator, a line-of-sight electrical barrier is achieved between the shielding element and the test surface and chuck performance is improved.

FIGS. 15 and 15A illustrate another embodiment in which the fourth conductive element 3 is disposed along the outer edge and bottom portion of the chuck insulator 4. In this embodiment, the conductive element 3 is coupled to conductive element 5, which together are isolated from the center conductive element 2. The conductive elements 3 and 5 may thus provide a conductive guard barrier which also facilitates reduced capacitive coupling with respect to the center conductive element 2.

Figure 16:
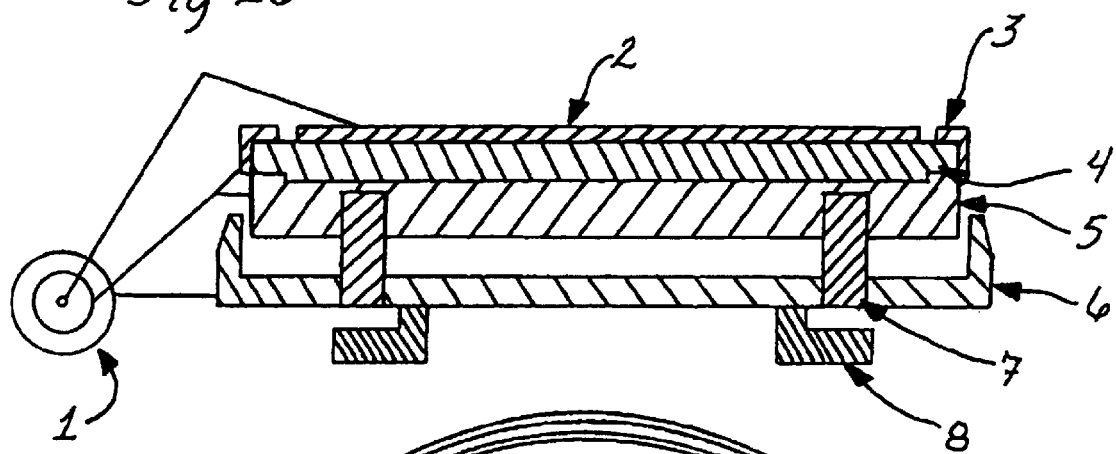
FIG. 16 is a cross-sectional schematic of a further embodiment of a chuck apparatus in accordance with the invention in which the insulator is mated in a recess in the lower conductive element.
Figure 16A:
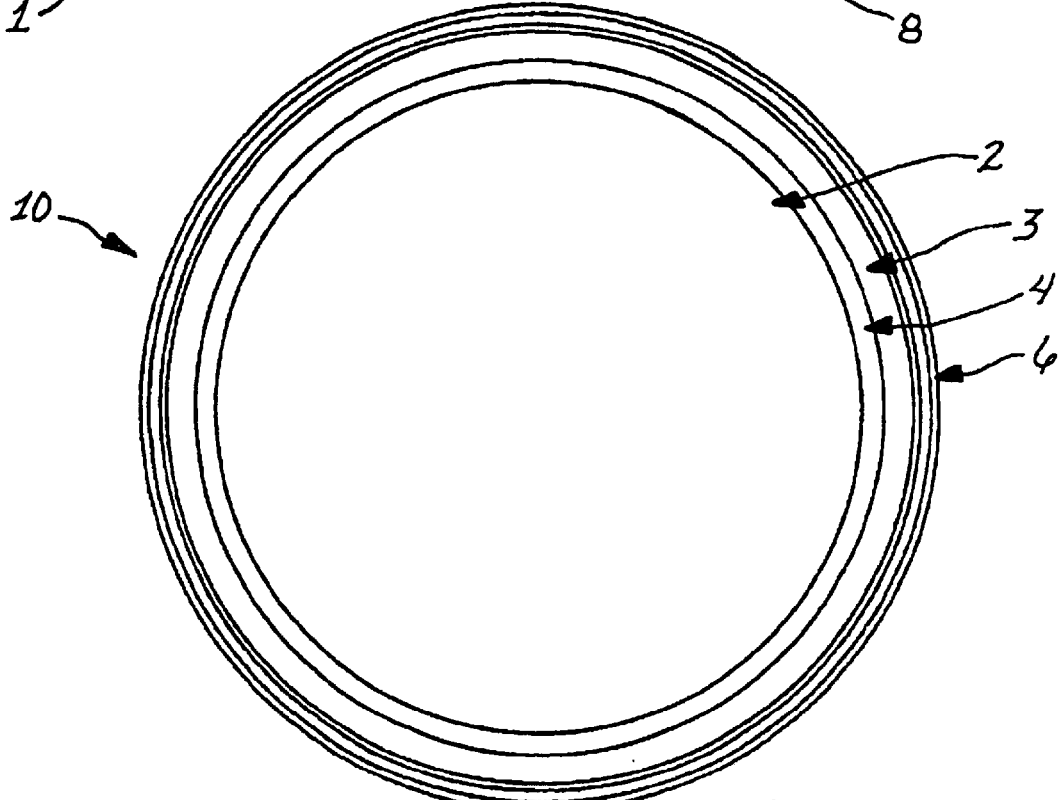
FIG. 16A illustrates a top plan view of the chuck of FIG. 16.

It will be appreciated that numerous other variation of the chuck apparatuses described herein may be provided in accordance with the invention. FIGS. 16 and 16A illustrate a further aspect of the invention in which insulator 4 has a thicker central portion and a thinner peripheral portion and conductive element 5 includes a central recessed portion for receiving the thicker central portion of the insulator. In this aspect of the invention, the mating of the central portion of insulator 4 and the recess of conductive element 5 maintains proper registration of these elements with respect to each other. In one aspect, the insulator 4 is approximately 0.312 inches thick at its center and 0.262 inches thick at its outer periphery and the central recess of conductive element 5 is approximately 0.050 inches deep for receiving the central portion of the insulator. Although this aspect of the invention is illustrated in FIGS. 16 and 16A with respect to a chuck apparatus otherwise in accordance with the embodiment of FIG. 7, such an arrangement of the insulator 4 with respect to conductive element 5 may, of course, also be utilized in any of the ether embodiments of the invention described herein.

As a further aspect of the invention, FIGS. 17, 17A and 17B illustrate that the isolated conductive element 3 may be provided to extend around the periphery of insulator 4 along the upper, side, and lower surface of insulator 4. In the embodiment illustrated, the conductive element 3 wraps around the insulator 4 and extends into the groove provided at the outer periphery of the bottom surface of the insulator.

As shown more clearly in the exploded view of FIG. 17B, the conductive material forming conductive element 3 does not completely fill the peripheral insulator groove, and the center portion of insulator 4 protrudes beyond the conductive element 3 for mating with the corresponding central recess in conductive element 5 to maintain proper registration between the insulator 4 and conductive element 5. By extending the conductive element 3 to wrap around the outer portion of the bottom surface of insulator 4, improved line of sight guarding may be achieved between the center conductive element 2 and the shield conductive element 6, particularly in embodiments such as shown in. FIGS. 3–6 where the diameter of the insulator 4 is larger than the diameter of conductive element 5.

Accordingly, in each of the above-described embodiments and examples, a chuck apparatus comprises a conductive wafer support surface deposited on an insulator element. The insulator element is supported on a further conductive element, which in turn is spaced and isolated from a bottom conductor which extends laterally below the chuck apparatus. While the invention thus far described employs the conductive element supporting the insulator as a guard conductor, and the lower most conductor as a shield, one of skill in the art will recognize that numerous variations of this electrical hookup are possible and perhaps desirable depending on the desired test conditions. Thus, in the chuck apparatus illustrated in FIG. 2, both conductive element 5 and 6 man be grounded and used as a shield. Alternatively, both elements can be connected to a potential near that of the test potential and driven as guard elements, perhaps with other-conductive components of the probe station chassis grounded to provide shielding from external noise sources.

With respect to the embodiments of FIGS. 3–10A and 15–17B, which incorporate the isolated annular fourth conductive element 3, the element 3 may be driven as a guard or grounded to provide shielding. The same applies to isolated conductive elements 5 and 6. Thus, it will be appreciated that the chuck apparatus of those embodiments contains three isolated conductive elements in the vicinity of the test surface which may be coupled to each other, to a guard line, or to a ground connection in any desired coaxial or triaxial arrangement to facilitate an electrical environment at the point of testing suitable for the test to be conducted. For example in some applications it may be desirable to ground all three available conductive elements; whereas in others the conductive element 3 may be driven as a guard and elements 5 and 6 grounded. Thus, the unique design of the chuck apparatus of the invention provides substantial flexibility in test setup and operation.

Moreover, while the invention has been described in accordance with the preferred embodiment as a thermal chuck, the invention may also be applied to non-temperature controlled, or ambient chucks. In such an embodiment, the heating, cooling, and temperature sensor elements are omitted from the bulk of conductive element 5.

The chuck apparatus of the invention is suitable for use in any number of available probe stations to provide guarding and shielding capabilities for low current measurements. For example, it is not necessary that a bellows be provided between the probe station base and platen or that the bellows include a conductive lining, although such features facilitate additional shielding from external sources of noise. The probe station may include various alternative manual or motorized controls for moving the chuck apparatus in the X, Y and/or vertical Z directions. In any probe station, the chuck apparatus provides a superior design with improved noise and thermal characteristics.

The invention also encompasses a method of manufacturing the chuck apparatus embodiment described above. The method involves providing an insulator plate of suitable thermal conductivity and of a size sufficient to accommodate the test wafer, the conductive element disposed on its periphery, and a suitable gap therebetween. The center conductive surface and isolated peripheral ring conductor may be deposited by any known metal deposition technique such as plasma discharge sputtering, chemical vapor deposition, or electroplating. A solid mask technique may be used to interrupt the deposition of conductive material between the center and outer periphery of the insulator 4. This method involves placing a solid metal or ceramic ring on the insulator at the desired location of interruption, depositing the conductive material over the insulator and ring, followed by removing the ring to provide the two separated areas of conducive material. The side surface of the insulator, bottom surface or a portion thereof may also be coated with conductive material during the deposition process. A suitable photomasking technique may also be used to deposit the spaced conductive coatings on the insulator. Regardless of the method employed, the deposition is performed so as to leave a radial space between the conductive elements that is preferably at least as large as the thickness of the insulator.

The coated insulator may then be supported on a conductive thermal element formed by encapsulating heating and cooling elements in an aluminum alloy. In the preferred method, metal cooling tubes are suspended in a casting mold. Additional tubes containing electric heating elements are also suspended in the mold, as are one or more temperature sensors. Molten aluminum is poured into the mold and allowed to cool so as to completely encapsulate those elements with minimal air gaps, so as to provide better temperature uniformity. The mold may provide a recess in the upper surface of the thermal element for receiving a protruding central portion of the insulator and maintaining proper registration or alignment of these components.

The resulting thermal disk may be attached to a laterally extending conductive element by insulated fasteners which also serve to space the heated disk from the laterally extending conductor. The preferred insulator is sapphire rods, and the rods are preferably press fit into bores in the conductive thermal disk and the lower laterally extending conductive element. The laterally extending conductor is then connected to a lower insulative adaptor for connecting the chuck apparatus to a positioning mechanism. Suitable electrical connections should also be provided to each of the conductive elements of the chuck apparatus to complete the apparatus.

While the foregoing described embodiments have been set forth above, it will be appreciated to one skilled in the art that the inventions described have applications beyond the described embodiments. Accordingly, it is intended that the scope of the invention including such alternatives, modifications, and variations contemplated shall be defined by the appended claims.

What is claimed is:

1. A chuck apparatus for a wafer probe station, comprising:
   a laterally extending electrical insulator;
   a first conductive member disposed on said insulator for supporting a wafer device under test;
   said insulator supported on a second conductive member; and
   a third conductive member isolated from said second conductive member and having a laterally extending portion spaced below said second conductive member and a vertically extending sidewall portion terminating generally below the first conductive member.

2. A chuck apparatus as recited in claim 1, wherein the insulator has an upper surface including an outer periphery thereof, with the first conductive member supported on the upper surface so as not to extend beyond the outer periphery of the first conductive member upper surface.

3. A chuck apparatus as recited in claim 1, wherein the insulator includes an upper surface on which the first insulator is supported and an electrically isolated fourth conductive member disposed on the upper surface of the insulator in spaced relation to the first conductive member.

4. A chuck apparatus as recited in claim 3, wherein the insulator upper surface includes a recessed portion in which the first conductor is disposed.

5. A chuck apparatus as recited in claim 4, wherein the first conductive member includes an upper surface that is co-planar with the insulator upper surface.

6. A chuck apparatus as recited in claim 3, wherein the insulator upper surface has a peripherally groved portion in which the fourth conductive member is disposed.

7. A chuck apparatus as recited in claim 6, wherein the fourth conductive member has an upper surface that is co-planar with the insulator upper surface.

8. A chuck apparatus for providing a low-noise environment for evaluating a wafer device under test, comprising:
   a laterally extending electrical insulator having an upper surface;
   a first conductive member disposed an the upper surface of the insulator for supporting a wafer device under test;
   a second conductive member an which the insulator is supported; and
   a third conductive member isolated from the second conductive member and having a portion extending laterally below the second conductive member; and
   an upstanding portion of the third conductive member that extends upwardly from the laterally extending portion to a predetermined position such that the second conductive member provides a line-of-sight barrier between a majority of the first conductive member and the third conductive member upwardly extending portion and which minimizes effects of capacitance between the first conductive member and the third conductive member upwardly portion.

9. A chuck apparatus as recited an claim 8, wherein the predetermined position is generally below the first conductive member.

10. A chuck apparatus as recited in claim 8, wherein the predetermined position is generally laterally aligned with the second conductive member.

11. A chuck apparatus as recited in claim 8, wherein the predetermined position is generally below the insulator.

12. A chuck apparatus as recited in claim 8, wherein the first conductive member has an upper surface and the predetermined position is 5 to 10 mm below the upper surface of the first conductive member.

13. A chuck apparatus as recited in claim 8, wherein the insulator has an upper surface including an outer periphery thereof, with the first conductive member supported on the upper surface so as not to extend beyond the outer periphery of the first conductive member upper surface.

14. A chuck apparatus as recited in claim 8, wherein the insulator includes an upper surface on which the first insulator is supported and an electrically isolated fourth conductive member disposed on the upper surface of the insulator in spaced relation to the first conductive member.

15. A chuck apparatus as recited in claim 14, wherein the insulator upper surface includes a recessed portion in which the first conductor is disposed.

16. A chuck apparatus as recited in claim 15, wherein the first conductive member includes an upper surface that is co-planar with the insulator upper surface.

17. A chuck apparatus as recited in claim 14, wherein the insulator upper surface has a peripherally grooved portion in which the fourth conductive member is disposed.

18. A chuck apparatus as recited in claim 17, wherein the fourth conductive member has an upper surface that is co-planar with the insulator upper surface.

19. A chuck apparatus for a wafer probe station, comprising:
   a laterally extending electrical insulator;
   a first conductive member disposed on the insulator for supporting a wafer device under test;
   a second conductive member;
   a third conductive member isolated from and spaced below the second conductive member; and
   an electrically isolated fourth conductive member disposed on the insulator to allow for flexibility in connecting the fourth conductive member to different electric potentials to provide accuracy in testing of the wafer device.

20. A chuck apparatus as recited is claim 19, wherein the insulator upper surface has a peripherally grooved portion in which the fourth conductive member is disposed.

21. A chuck apparatus as recited in claim 19, wherein the fourth conductive member has an upper surface that is co-planar with the insulator upper surface.

22. The chuck apparatus of claim 19, wherein the fourth conductive member is connected as a shield or as a guard relative to the first conductive member.

23. The chuck apparatus of claim 19, wherein the fourth conductive member is disposed at a predetermined position on the insulator to minimize capacitive effects between the first conductive member and the third conductive member.

24. The chuck apparatus of claim 19, wherein the second conductive member and the fourth conductive member are connected to the same electrical potential as the first conductive member.

25. The chuck apparatus of claim 19, wherein the fourth conductive member is connected to ground.

* * * * *

UNITED STATES PATENT AND TRADEMARK OFFICE
CERTIFICATE OF CORRECTION

PATENT NO. : 6,803,756 B2
DATED : October 12, 2004
INVENTOR(S) : Hollman et al.

It is certified that error appears in the above-identified patent and that said Letters Patent is hereby corrected as shown below:

Column 14,
Line 21, change "groved" to -- grooved --;
Line 30, change "an" to -- on --;
Line 33, change "an" to -- on --; and
Line 34, delete "and".

Signed and Sealed this

Twenty-eighth Day of June, 2005

JON W. DUDAS
*Director of the United States Patent and Trademark Office*